US010833403B2

United States Patent
Kim et al.

(10) Patent No.: US 10,833,403 B2
(45) Date of Patent: Nov. 10, 2020

(54) ANTENNA AND ELECTRONIC DEVICE INCLUDING SAME

(71) Applicant: Samsung Electronics Co., Ltd., Suwon-si (KR)

(72) Inventors: Jaehyung Kim, Suwon-si (KR); Hanbin Lee, Suwon-si (KR); Sangmin Han, Suwon-si (KR); Jongsuk Kim, Suwon-si (KR); Taegyu Kim, Suwon-si (KR); Minseok Park, Suwon-si (KR); Jinkyu Bang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/402,688

(22) Filed: May 3, 2019

(65) Prior Publication Data

US 2019/0341688 A1    Nov. 7, 2019

(30) Foreign Application Priority Data

May 4, 2018    (KR) .......................... 10-2018-0052101

(51) Int. Cl.
*H01Q 1/24* (2006.01)
*H01Q 1/50* (2006.01)
(Continued)

(52) U.S. Cl.
CPC ............ *H01Q 1/526* (2013.01); *G06F 1/1698* (2013.01); *H01Q 1/243* (2013.01); *H01Q 1/38* (2013.01);
(Continued)

(58) Field of Classification Search
CPC ............ H01Q 3/44; H01Q 1/50; H01Q 1/243; H01Q 1/088; H01Q 1/38; H01Q 9/0421;
(Continued)

(56) References Cited

U.S. PATENT DOCUMENTS 10,158,163 B2 *  12/2018  Gang .................. H01Q 21/28
2013/0094126 A1   4/2013  Rappoport et al.
(Continued)

FOREIGN PATENT DOCUMENTS

| KR | 10-2016-0104482 A | 9/2016 |
| KR | 10-2018-0035605 A | 4/2018 |
| KR | 10-2018-0105356 A | 9/2018 |

OTHER PUBLICATIONS

International Search Report with Written Opinion dated Aug. 26, 2019; International Appln. No. PCT/KR2019/005307.

*Primary Examiner* — Minh D A
(74) *Attorney, Agent, or Firm* — Jefferson IP Law, LLP

(57) ABSTRACT

An electronic device is provided. The electronic device includes a housing, a touch screen display arranged inside the housing, a printed circuit board (PCB) which is arranged in parallel with a rear plate, and which includes a ground plane and a conductive path, and a wireless communication circuit arranged on the PCB. The housing includes a first side surface, a second side surface, a third side surface, and a fourth side surface. The first side surface includes a first conductive part, a first nonconductive part, a second conductive part, a second nonconductive part, and a third conductive part successively arranged between the second side surface and the fourth side surface. The rear plate includes, when seen from above the rear plate, a nonconductive slit extending from the first nonconductive part to the second nonconductive part, a first conductive area, and a second conductive area positioned outside the first conductive area across the nonconductive slit.

20 Claims, 17 Drawing Sheets

(51) Int. Cl.
   *H01L 35/00*   (2006.01)
   *H01Q 1/52*   (2006.01)
   *H05K 1/02*   (2006.01)
   *G06F 1/16*   (2006.01)
   *H01Q 1/38*   (2006.01)
   *H01Q 1/48*   (2006.01)
   *H01Q 5/35*   (2015.01)
   *H04M 1/02*   (2006.01)

(52) U.S. Cl.
   CPC .............. *H01Q 1/48* (2013.01); *H01Q 1/523* (2013.01); *H01Q 5/35* (2015.01); *H04M 1/0283* (2013.01); *H05K 1/0215* (2013.01); *H05K 1/0224* (2013.01)

(58) Field of Classification Search
   CPC ...... H01Q 1/244; H01Q 1/242; B65D 65/403; B65D 2203/10; G06K 19/07749; H01L 35/00; H01R 2201/02; H01R 2103/00
   See application file for complete search history.

(56) References Cited

U.S. PATENT DOCUMENTS

| | | |
|---|---|---|
| 2014/0111684 A1 | 4/2014 | Corbin et al. |
| 2014/0270303 A1 | 9/2014 | Cheng et al. |
| 2015/0070219 A1 | 3/2015 | Dinh et al. |
| 2016/0254832 A1 | 9/2016 | Yoo et al. |
| 2018/0069301 A1* | 3/2018 | Choi ...................... H01Q 3/247 |
| 2018/0076507 A1* | 3/2018 | Heo ....................... H01Q 1/243 |
| 2018/0090821 A1 | 3/2018 | Lee et al. |
| 2018/0269561 A1 | 9/2018 | Kim et al. |

* cited by examiner

ANTENNA AND ELECTRONIC DEVICE INCLUDING SAME

CROSS-REFERENCE TO RELATED APPLICATION(S)

This application is based on and claims priority under 35 U.S.C. § 119(a) of a Korean patent application number 10-2018-0052101, filed on May 4, 2018, in the Korean Intellectual Property Office, the disclosure of which is incorporated by reference herein in its entirety.

BACKGROUND

1. Field

The disclosure relates to an antenna and an electronic device including the same.

2. Description of Related Art

The functional gap between electronic devices made by respective manufacturers has substantially decreased, and electronic devices have thus been developed not only to have increased rigidity such that consumer use convenience and purchasing desires are satisfied, but also to ensure enhanced design aesthetics and slimness.

Electronic devices may include at least one antenna so as to support various frequencies used for various wireless communication services. For example, electronic devices may include antennas for supporting various wireless communication services such as long term evolution (LTE), Wi-Fi, near field communication (NFC), and Bluetooth™.

An electronic device may include a housing, at least a part of which is made of a conductive member (for example, a metallic member). In this case, at least a partial area (for example, a conductive area) of the conductive member of the housing may be used as an antenna. The electronic device may include a metallic housing (for example, a rear plate) arranged such that at least a part thereof is electrically isolated from the periphery. The conductive area of the metallic housing (for example, a rear plate), which is electrically isolated, may be electrically connected to at least one communication circuit mounted on the printed circuit board so as to operate as an antenna. For example, the conductive area may be electrically connected to the communication circuit at different points so as to operate as a multi-band antenna in different frequency bands.

However, if multiple antenna feeding portions are added such that the conductive area of the housing forms multi-band resonance, the problem of isolation between the feeding portions may occur, thereby degrading the radiation performance of the antenna.

The above information is presented as background information only, and to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages, and to provide at least the advantages described below. Accordingly, an aspect of the disclosure is to provide an antenna and an electronic device including the same.

Another aspect of the disclosure is to provide an antenna capable of setting the operating frequency band of the antenna in a desired band by using an isolation structure and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a front plate, a rear plate facing in the opposite direction to the front plate, and a side member surrounding the space between the front plate and the rear plate. The side member includes a first side surface extending in a first direction and having a first length, a second side surface extending in a second direction perpendicular to the first direction and having a second length larger than the first length, a third side surface extending in parallel with the first side surface and having the first length, and a fourth side surface extending in parallel with the second side surface and having the second length, the first side surface including a first conductive part, a first nonconductive part, a second conductive part, a second nonconductive part, and a third conductive part successively arranged between the second side surface and the fourth side surface. The rear plate includes, when seen from above the rear plate, a nonconductive slit extending from the first nonconductive part to the second nonconductive part, a first conductive area surrounded by the second conductive part and the nonconductive slit, and a second conductive area positioned outside the first conductive area across the nonconductive slit. A touch screen display is arranged inside the housing and exposed through a part of the front plate, a printed circuit board including a ground plane is arranged between the front plate and the rear plate in parallel with the rear plate, the ground plane including a peripheral part spaced apart from the first side surface, and the printed circuit board including a conductive path extending from a first point of the peripheral part to a second point thereof toward the first side surface such that, when seen from above the rear plate, the first point overlaps with the second conductive area, and the second point overlaps with the first conductive area. A first flexible conductive member is arranged between the first point and the second conductive area of the rear plate so as to make an electric connection therebetween, a second flexible conductive member is arranged between the second point and the first conductive area of the rear plate so as to make an electric connection therebetween, a third flexible conductive member is arranged between the third point and the first conductive area of the rear plate so as to make an electric connection therebetween, a fourth flexible conductive member is arranged between the fourth point and the first conductive area of the rear plate so as to make an electric connection therebetween, and at least one wireless communication circuit is arranged on the printed circuit board and electrically connected to the third point and the fourth point, wherein, when seen from above the rear plate, the third point and the fourth point may be arranged on both sides of the conductive path, respectively.

According to embodiments of the disclosure, when a conductive area arranged on at least a part of a housing is used as an antenna, a structure of isolation between feeding portions is applied such that degradation of the antenna radiation performance as a result of mutual interference can be prevented, and the antenna can be set in a desired operating frequency band by setting the isolation structure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the," include plural referents unless the context clearly dictates otherwise. Thus, for example, reference to "a component surface" includes reference to one or more of such surfaces.

Figure 1:
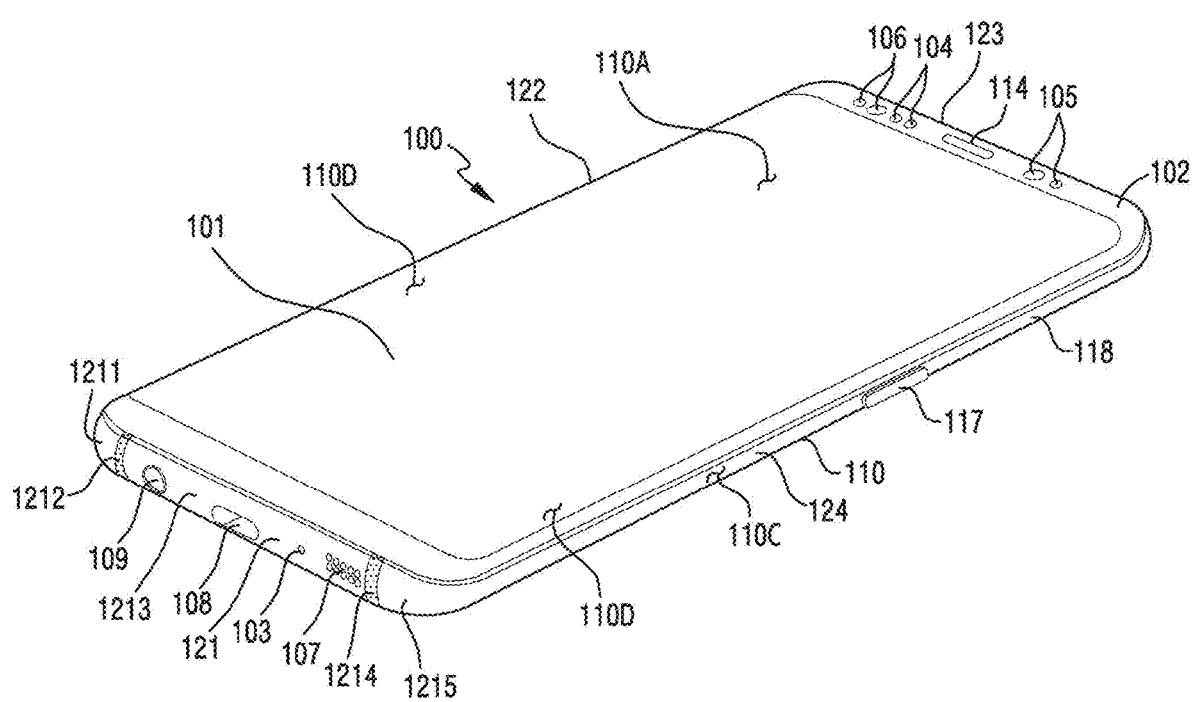
FIG. 1 is a front perspective view of a mobile electronic device according to embodiments of the disclosure.

FIG. 1 is a front perspective view of a mobile electronic device according to embodiments of the disclosure.

Figure 2:
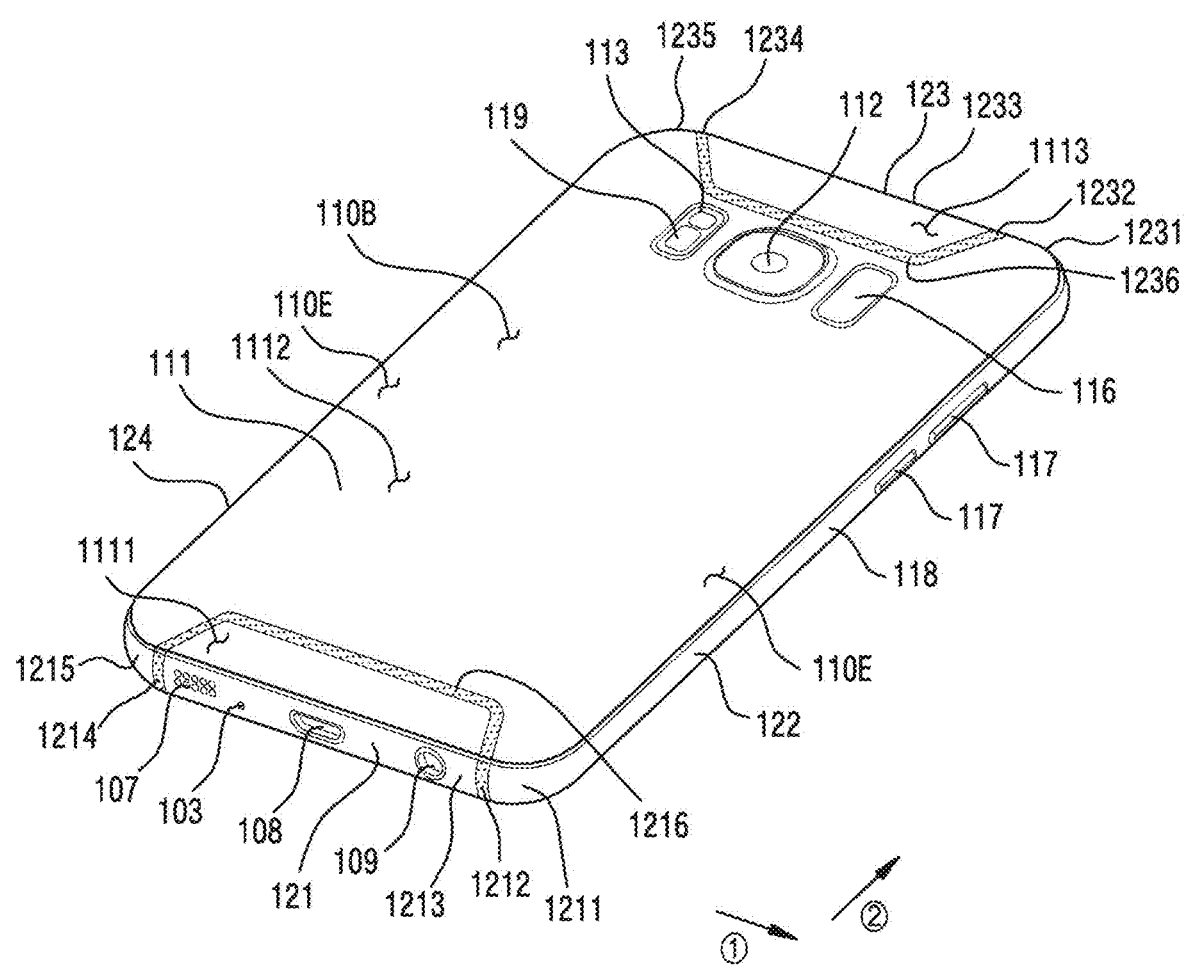
FIG. 2 is a rear perspective view of the electronic device of FIG. 1 according to embodiments of the disclosure.

FIG. 2 is a rear perspective view of the electronic device of FIG. 1 according to embodiments of the disclosure.

Referring to FIGS. 1 and 2, an electronic device 100 according to an embodiment may include a housing 110 including a first surface (or front surface) 110A, a second surface (or rear surface) 110B, and a side surface 110C surrounding the space between the first surface 110A and the second surface 110B. In another embodiment (not illustrated), the housing may refer to a structure forming some of the first surface 110A, the second surface 110B, and the side surface 110C illustrated in FIG. 1. According to an embodiment of the disclosure, the first surface 110A may be formed by a front plate 102 (for example, a glass plate including various coating layers or a polymer plate), at least a part of which is substantially transparent. The second surface 110B may be formed by a rear plate 111 that is substantially opaque. The rear plate 111 may be made of, for example, coated or colored glass, ceramic, a polymer, a metal (for example, aluminum, stainless steel (STS), or magnesium), or a combination of at least two of above materials. The side surface 110C may be formed by a side bezel structure (or "side member") 118 which is coupled to the front plate 102 and to the rear plate 111, and which includes a metal and/or a polymer. In some embodiments, the rear plate 111 and the side bezel structure 118 may be formed integrally and include the same material (for example, a metallic material such as aluminum).

In the illustrated embodiment, the front plate 102 may include two first areas 110D on both ends of the long edge of the front plate 102 such that the two first areas 110D extend seamlessly so as to bend from the first surface 110A toward the rear plate 111. In the illustrated embodiment (see FIG. 2), the rear plate 111 may include two second areas 110E on both ends of the long edge thereof such that the two second areas 110E extend seamlessly so as to bend from the second surface 110B toward the front plate 102. In some embodiments of the disclosure, the front plate 102 (or the rear plate 111) may include only one of the first areas 110D (or the second areas 110E). In another embodiment of the disclosure, a part of the first areas 110D or the second areas 110E may not be included. In the above embodiment, when seen from the side surface of the electronic device 100, the side bezel structure 118 may have a first thickness (or width) near a part of the side surface not including the above-mentioned first areas 110D or the second areas 110E and may have a second thickness, which is smaller than the first thickness, near a part of the side surface including the first areas 110D or the second area 110E.

According to an embodiment of the disclosure, the electronic device 100 may include at least one of a display 101, audio modules 103, 107, and 114, sensor modules 104, 116, and 119, camera modules 105, 112, and 113, a key input device 117, a light-emitting element 106, and connector holes 108 and 109. In some embodiments of the disclosure, at least one of the constituent elements (for example, the key input device 117 or the light-emitting element 106) of the electronic device 100 may be omitted, or the same may further include another constituent element.

The display 101 may be exposed through a corresponding part of the front plate 102, for example. In some embodiments of the disclosure, at least a part of the display 101 may be exposed through the front plate 102 that forms the first surface 110A and the first areas 101D of the side surface 110C. In some embodiments of the disclosure, the display 101 may have a corner formed in a shape substantially identical to that of an adjacent outer periphery of the front plate 102. In another embodiment of the disclosure (not illustrated), in order to expand the area of exposure of the display 101, the interval between the outer periphery of the display 101 and the outer periphery of the front plate 101 may be formed to be substantially identical.

In another embodiment of the disclosure (not illustrated), a recess or an opening may be formed in a part of the screen display area of the display 101, and at least one of the audio module 114, the sensor module 104, the camera module 105, and the light-emitting module 106 may be included and aligned with the recess or the opening. In another embodiment of the disclosure (not illustrated), at least one of the audio module 114, the sensor module 104, the camera module 105, the fingerprint sensor 116, and the light-emitting element 106 may be provided on the rear surface of the screen display area of the display 101. In another embodiment of the disclosure (not illustrated), the display 101 may be coupled to or arranged to be adjacent to a touch sensing circuit, a pressure sensor capable of measuring the intensity (pressure) of a touch, and/or a digitizer for detecting a magnetic field-type stylus pen. In some embodiments of the disclosure, at least a part of the sensor modules 104 and 119 and/or at least a part of the key input device 117 may be arranged in the first areas 110D and/or in the second areas 110E.

The audio modules 103, 107, and 114 may include a microphone hole and speaker holes. A microphone may be arranged in the microphone hole so as to acquire external sounds, and multiple microphones may be arranged therein so as to sense the direction of sounds in some embodiments. The speaker holes may include an outer speaker hole for module 107 and a speech receiver hole for module 114. In some embodiments of the disclosure, the speaker holes and the microphone hole may be implemented as a single hole, or a speaker (for example, a piezoelectric speaker) may be provided without the speaker holes.

The sensor modules 104, 116, and 119 may generate an electric signal or data value corresponding to the internal operating condition of the electronic device 100 or the external environmental condition. The sensor modules 104, 116, and 119 may include, for example, a first sensor module 104 (for example, a proximity sensor) arranged on the first surface 110A of the housing 110, and/or a second sensor module (not illustrated) (for example, a fingerprint sensor), and/or a third sensor module 119 (for example, a heart rate monitor (HRM sensor)) arranged on the second surface 110B of the housing 110, and/or a fourth sensor module 116 (for example, a fingerprint sensor). The fingerprint sensor may be arranged not only on the first surface 110A (for example, the display 101) of the housing 110, but also on the second surface 110B thereof. The electronic device 100 may further include a sensor module that is not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules (or devices) 105, 112, and 113 may include the first camera device 105 arranged on the first surface 110A of the electronic device 100, the second camera device 112 arranged on the second surface 110B thereof, and/or the flash 113. The camera devices 105 and 112 may include one lens or multiple lenses, an image sensor, and/or an image signal processor (ISP). The flash 113 may include a light-emitting diode or a xenon lamp, for example. In some embodiments, at least two lenses (an IR camera, a wide-angle lens, and a telephoto lens) and image sensors may be arranged on a surface of the electronic device 100.

The key input device 117 may be arranged on the side surface 110C of the housing 110. In another embodiment of the disclosure, the electronic device 100 may not include part or all of the above-mentioned key input device 117, and the key input device 117 not included may be implemented on the display 101 in another type, such as a soft key. In some embodiments, the key input device may include the sensor module 116 arranged on the second surface 110B of the housing 110.

The light-emitting element 106 may be arranged on the first surface 110A of the housing 110, for example. The light-emitting element 106 may provide information regarding the condition of the electronic device 100 in an optical type, for example. In another embodiment of the disclosure, the light-emitting element 106 may provide a light source that interworks with the operation of the camera module 105, for example. The light-emitting element 106 may include a light emitting diode (LED), an IR LED, and a xenon lamp, for example.

The connector holes 108 and 109 may include the first connector hole 108 capable of containing a connector (for example, a universal serial bus (USB) connector) for transmitting/receiving power and/or data to/from an external electronic device and/or the second connector hole (for example, an earphone jack) 109 capable of containing a connector for transmitting/receiving audio signals to/from the external electronic device.

According to embodiments of the disclosure, the side bezel structure 118 (for example, the side surface or side member) may include a first side surface 121 which extends in a first direction (direction ①), and which has a first length; a second surface 122 which extends in a second direction (direction ②) that is perpendicular to the first direction, and which has a second length that is larger than the first length; a third side surface 123 which extends in parallel with the first side surface 121, and which has the first length; and a fourth side surface 124 which extends in parallel with the second side surface 122, and which has the second length. According to an embodiment of the disclosure, the first side surface 121 may include a first conductive part 1211, a first nonconductive part 1212, a second conductive part 1213, a second nonconductive part 1214, and a third conductive part 1215 arranged successively between the second side surface 122 and the fourth side surface 124. According to an embodiment of the disclosure, the third side surface 123 may include a fourth conductive part 1231, a third nonconductive part 1232, a fifth conductive part 1233, a fourth nonconductive part 1234, and a sixth conductive part 1235 successively arranged between the second side surface 122 and the fourth side surface 124.

According to embodiments of the disclosure, at least a part of the rear plate 111 may be made of a conductive material (for example, a metallic member). According to an embodiment of the disclosure, the rear plate 111 may be divided into a first conductive area 1111, a second conductive area 1112, and a third conductive area 1113 by a first nonconductive slit 1216 and a second nonconductive slit 1236. According to an embodiment of the disclosure, the rear plate 111 may include, when the rear plate 111 is seen from above, a first nonconductive slit 1216 which surrounds the first conductive area 1111 together with the second conductive part 1213, and which extends from the first nonconductive part 1212 to the second nonconductive part 1214. According to an embodiment of the disclosure, the rear plate 111 may include, when the rear plate 111 is seen from above, the second nonconductive slit 1236 which surrounds the third conductive area 1113 together with the fifth conductive part 1233, and which extends from the third nonconductive part 1232 to the fourth nonconductive part 1234. According to an embodiment of the disclosure, the area and/or shape of the first conductive area 1111 may be defined according to the radiation characteristics of the antenna. According to an embodiment of the disclosure, the area and/or shape of the first conductive area 1111 and the area and/or shape of the third conductive area 1113 may or may not be identical to each other.

Figure 4A:
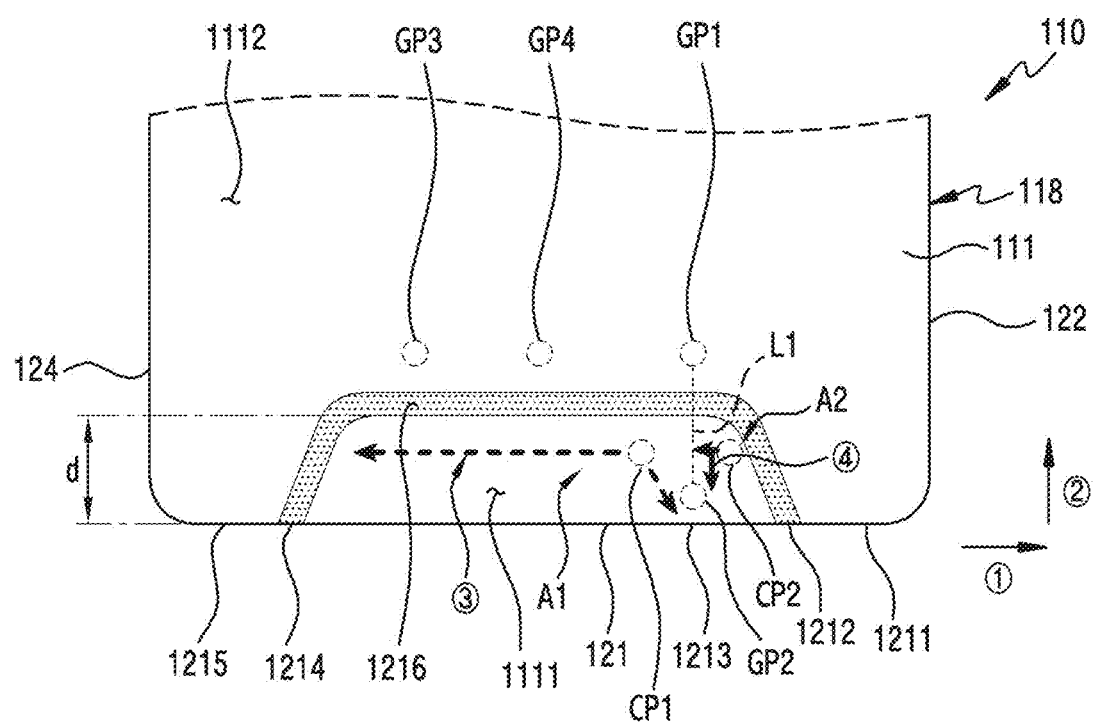
FIG. 4A illustrates a configuration of a housing according to embodiments of the disclosure.
Figure 4B:
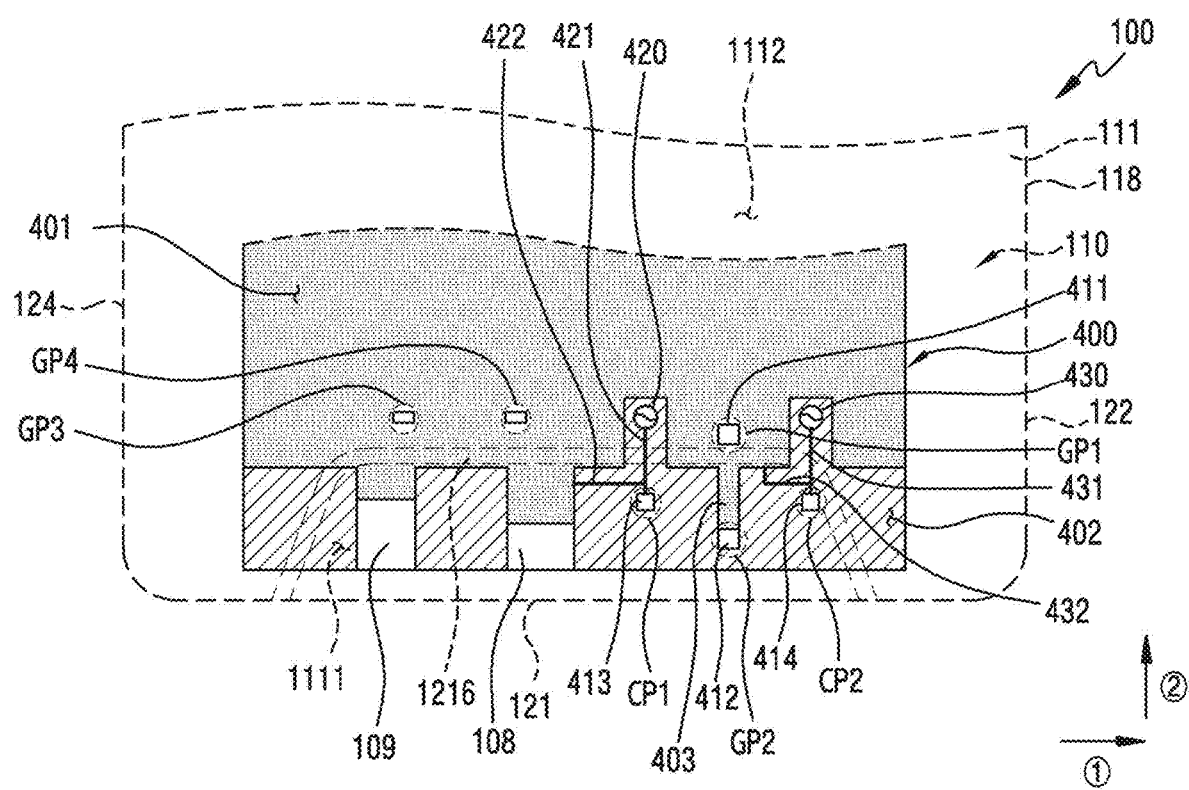
FIG. 4B is a diagram of an electronic device illustrating a configuration of an antenna as a result of coupling a printed circuit board and the housing of FIG. 4A according to embodiments of the disclosure.

According to embodiments of the disclosure, the first conductive area 1111 of the rear plate 111, which is electrically divided by the first nonconductive slit 1216, may be electrically connected to at least one communication circuit (for example, communication circuits using feeding portions 420 and 430 in FIG. 4B) mounted on the printed circuit board (for example, the printed circuit board 400 in FIG. 4B) so as to operate as an antenna in at least one frequency band. According to an embodiment of the disclosure, the first conductive area 1111 may be connected to the printed circuit board at least one point physically and electrically. According to an embodiment of the disclosure, if the first conductive area 1111 is electrically connected to respective communication circuits at two points that are spaced apart from each other, the resulting mutual interference may degrade the radiation performance. Accordingly, in embodiments of the disclosure, a ground extension portion (the ground extension portion 403 in FIG. 4B) may be provided to isolate respective points. According to an embodiment of the disclosure, the ground extension portion may extend from a main ground plane (for example, the main ground plane 401 in FIG. 4B) of the printed circuit board to a nonconductive area (for example, the nonconductive area in FIG. 4B) of the board, thereby inducing efficient resonance in different frequency bands at the two points. According to an embodiment of the disclosure, the third conductive area 1113 may also be formed substantially identically to the above-described first conductive area 1111 so as to operate as another antenna.

According to embodiments of the disclosure, since the first nonconductive slit 1216 and/or the second nonconductive slit 1236 extend on the rear plate 111 to the first side surface 121 and the third side surface 123, but not to the second side surface 122 and/or the fourth side surface 124, degradation of the radiation performance of the antenna occurring when a side surface (for example, the second side surface 122 and/or the fourth side surface 124) of the electronic device 100 is grasped (so-called a "hand effect") may be prevented.

Figure 3:
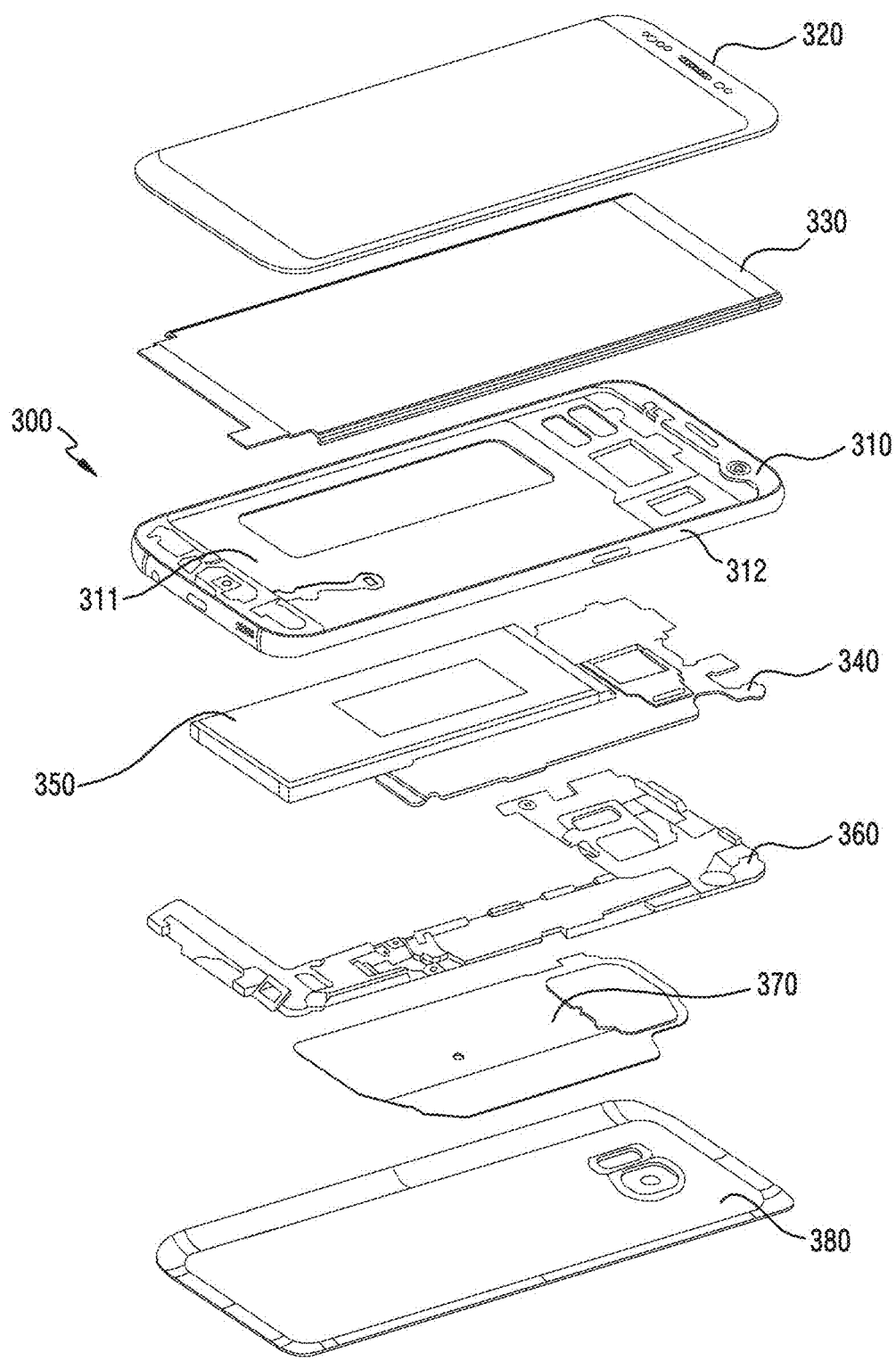
FIG. 3 is an exploded perspective view of the electronic device of FIG. 1 according to embodiments of the disclosure.

FIG. 3 is an exploded perspective view of the electronic device of FIG. 1 according to embodiments of the disclosure.

Referring to FIG. 3, an electronic device 300 (for example, the electronic device 100 in FIG. 1) may include a side bezel structure 310 (for example, the side bezel structure 118 in FIG. 2), a first support member 311 (for example, a bracket), a front plate 320 (for example, the front plate 102 in FIG. 1), a display 330 (for example, the display 101 in FIG. 1), a printed circuit board 340, a battery 350, a second support member 360 (for example, a rear case), an antenna 370, and a rear plate 380 (for example, the rear plate 111 in FIG. 2). In some embodiments of the disclosure, at least one of the constituent elements of the electronic device 300 (for example, the first support member 311 or the second support member 360) may be omitted, or the electronic device 300 may further include another constituent element. At least one of the constituent elements of the electronic device 300 may be identical or similar to at least one of the constituent elements of the electronic device 100 in FIG. 1 or FIG. 2, and repeated descriptions thereof will be omitted herein.

The first support member 311 may be arranged inside the electronic device 300 and connected to the side bezel structure 310, or may be formed integrally with the size bezel structure 310. The first support member 311 may be made of a metallic material and/or a nonmetallic material (for example, a polymer), for example. The display 330 may be coupled to one surface of the first support member 311, and the printed circuit board 340 may be coupled to the other surface thereof. A processor, a memory, and/or an interface may be mounted on the printed circuit board 340. The processor may include, for example, one or more of a central processing device, an application processor (AP), a graphic processing device, an ISP, a sensor hub processor, or a communication processor (CP).

The memory may include, for example, one or more of a volatile memory or a nonvolatile memory.

The interface may include, for example, a high definition multimedia interface (HDMI), a USB interface, a secure digital (SD) card interface, and/or an audio interface. The interface may connect the electronic device 300 with an external electronic device electrically or physically, for example, and may include a USB connector, an SD card/multimedia card (MMC) connector, or an audio connector.

The battery 350 is configured to supply power to at least one constituent element of the electronic device 300, and may include, for example, a primary battery that is not rechargeable, a secondary battery that is rechargeable, a fuel cell, or a combination thereof. At least a part of the battery 350 may be arranged on substantially the same plane with the printed circuit board 340, for example. The battery 350 may be integrally arranged inside the electronic device 300, and may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device, for example, or may wirelessly transmit/receive power necessary for charging. In another embodiment of the disclosure, an antenna structure may be formed by the side bezel structure 310 and/or a part of the first support member 311 or a combination thereof.

According to various embodiments of the disclosure, at least a part of the side bezel structure 310 may be made of a conductive material. According to an embodiment of the disclosure, the side bezel structure 310 may include a side surface 312 that forms at least a part of the exterior of the electronic device. According to an embodiment of the disclosure, at least a part of the side surface 312 may be arranged to the exposed to the outside along the periphery of the electronic device 300.

FIG. 4A illustrates a configuration of a housing according to embodiments of the disclosure.

FIG. 4B is a diagram of an electronic device illustrating a configuration of an antenna as a result of coupling a printed circuit board and the housing of FIG. 4A according to embodiments of the disclosure.

The printed circuit board 400 in FIG. 4B may be at least partially similar to the printed circuit board 340 in FIG. 3, or may include other embodiments of the printed circuit board.

Although the first nonconductive slit 1216 arranged on the periphery of the first side surface 121 of the side bezel structure 118 will be illustrated and described in the following description with reference to FIGS. 4A and 4B, the same is not limiting in any manner. It will be obvious that another nonconductive slit (for example, the second nonconductive slit 1236 in FIG. 2) may be arranged on the third side surface (for example, the third surface 123 in FIG. 2) that faces the first side surface 121 of the side bezel structure 118 in a manner similar to that of the first nonconductive slit 1216.

Referring to FIGS. 4A and 4B, the printed circuit board 400 may include the main ground plane 401 and a nonconductive area 402 that is adjacent to the main ground plane 401. According to an embodiment of the disclosure, when the rear plate 111 is seen from above, at least a part of the nonconductive area 402 may be positioned to substantially overlap the first conductive area 1111 divided by the first nonconductive slit 1216. According to an embodiment of the disclosure, the size of the nonconductive area 402 may be set according to the distance d between the first side surface 121 and the first nonconductive slit 1216.

According to embodiments of the disclosure, the board 400 may include the main ground plane 401 and the ground extension portion 403 extending toward the first side surface 121 from at least a part of the main ground plane 401 to a partial point of the nonconductive area 402. According to an embodiment of the disclosure, when the rear plate 111 is seen from above, the ground extension portion 403 may be formed to extend from a first ground point GP1 of the main ground plane 401 of the printed circuit board 400 across the first nonconductive slit 1216 to a second ground point GP2 of the nonconductive area 402. According to an embodiment of the disclosure, a first electric connector 411 may be mounted at the first ground point GP1 of the printed circuit board 400, and a second electric connector 412 may be mounted at the second ground point GP2. According to an embodiment of the disclosure, when the electronic device 100 is assembled, the second conductive area 1112 of the rear plate 111 may be electrically connected to the first electric connector 411, and the first conductive area 1111 may be electrically connected to the second electric connector 412, thereby forming the imaginary first isolation line L1 illustrated in FIG. 4A.

According to various embodiments, the printed circuit board 400 may include a third electric connector 413 mounted at a first contact point CP1 positioned on one side of the nonconductive area 402 of the printed circuit board 400 with reference to the first isolation line L1. According to an embodiment of the disclosure, the third electric connector 413 may be electrically connected to the first feeding portion 420 arranged on the printed circuit board 400 through a first electric path 421. According to an embodiment of the disclosure, the first feeding portion 420 may be electrically connected to a wireless communication circuit (not illustrated) (for example, the wireless communication module 1194 in FIG. 11) mounted on the printed circuit board 400. According to an embodiment of the disclosure, when the electronic device 100 is assembled, the first conductive area 1111 of the rear plate 111 may be electrically connected to the third electric connector 413 so as to operate as an antenna A1 having the first radiation path ③ in FIG. 4A. According to an embodiment of the disclosure, the first antenna A1 may operate as a planar inverted F antenna (PIFA) through a second electric path 422 which branches off from the first electric path 421, and which is connected to the main ground plane 401.

According to embodiments of the disclosure, the printed circuit board 400 may include a fourth electric connector 414 mounted at a second contact point CP2 positioned on the other side of the nonconductive area 402 of the printed circuit board 400 with reference to the first isolation line L1. According to an embodiment of the disclosure, the fourth electric connector 414 may be electrically connected to the second feeding portion 430 arranged on the printed circuit board 400 through a third electric path 431. According to an embodiment of the disclosure, the second feeding portion 430 may be electrically connected to a wireless communication circuit (not illustrated) (for example, the wireless communication module 1194 in FIG. 11) mounted on the printed circuit board 400. According to an embodiment of the disclosure, when the electronic device 100 is assembled, the first conductive area 1111 of the rear plate 111 may be electrically connected to the fourth electric connector 414 so as to operate as a second antenna A2 having the second radiation path ④ in FIG. 4A. According to an embodiment of the disclosure, the second antenna A2 may operate as a PIFA through a fourth electric path 432 which branches off from the third electric path 431, and which is connected to the main ground plane 401. Although not illustrated, an electric shock preventing circuit and a frequency-tuning matching circuit may be included in the first electric path 421 and the third electric path 431.

According to embodiments of the disclosure, the first feeding portion 420 may transmit/receive signals in a low band (for example, 700 MHz-900 MHz) through the first antenna A1 that uses the third electric connector 413 and the first conductive area 1111 of the rear plate 111. The second feeding portion 430 may transmit/receive signals in a mid-band (for example, 700 MHz-2200 MHz) through the second antenna A2 that uses the fourth electric connector 414 and the first conductive area 1111 of the rear plate 111.

According to embodiments of the disclosure, the electric connectors 411, 412, 413, and 414 may include a flexible conductive member that physically contacts the corresponding back surface of the rear plate 111 when the rear plate 111 is assembled. For example, the electric connectors 411, 412, 413, and 414 may include at least one of a C-clip, a conductive tape, or a conductive pad.

According to embodiments of the disclosure, the first conductive area 1111 of the rear plate 111 may be electrically connected to the printed circuit board 400 at the first contact point CP1 and the second contact point CP2, thereby operating as multiple antennas A1 and A2. In this case, the ground extension portion 403 arranged between the multiple antennas A1 and A2 enables the multiple antennas A1 and A2 to efficiently exhibit the radiation performance without mutual interference. According to an embodiment of the disclosure, the second conductive area 1112 of the rear plate 111 may be electrically connected to the main ground plane 401 of the printed circuit board 400 through a third ground point GP3 and a fourth ground point GP4, thereby accomplishing ground expansion and enhancement. According to an embodiment of the disclosure, the third ground point GP3 and the fourth ground point GP4 may be formed in substantially the same manner as the above-described electric connectors 411, 412, 413, and 414.

According to embodiments of the disclosure, the electronic device 100 may also include at least one electronic component mounted on the printed circuit board 400. For example, the at least one electronic component may include the interface connector port 108 and the ear jack assembly 109. According to an embodiment of the disclosure, when the electronic component is made of a conductive material, the same may be electrically connected to the main ground plane 401 of the printed circuit board 400 or may operate as a part of the antenna radiator (for example, a metal device antenna (MDA)). According to an embodiment of the disclosure, the electronic component may include at least one of an interface connector port, an ear jack assembly, a speaker device, a microphone device, a camera device, or various sensor modules.

According to embodiments of the disclosure, the first contact point CP1 and the second contact point CP2 may be implemented by a switching device instead of the electric connectors 413 and 414. In this case, the electronic device 100 may control the switching device so as to selectively operate the first antenna or the second antenna, or to operate both antennas.

Figure 5:
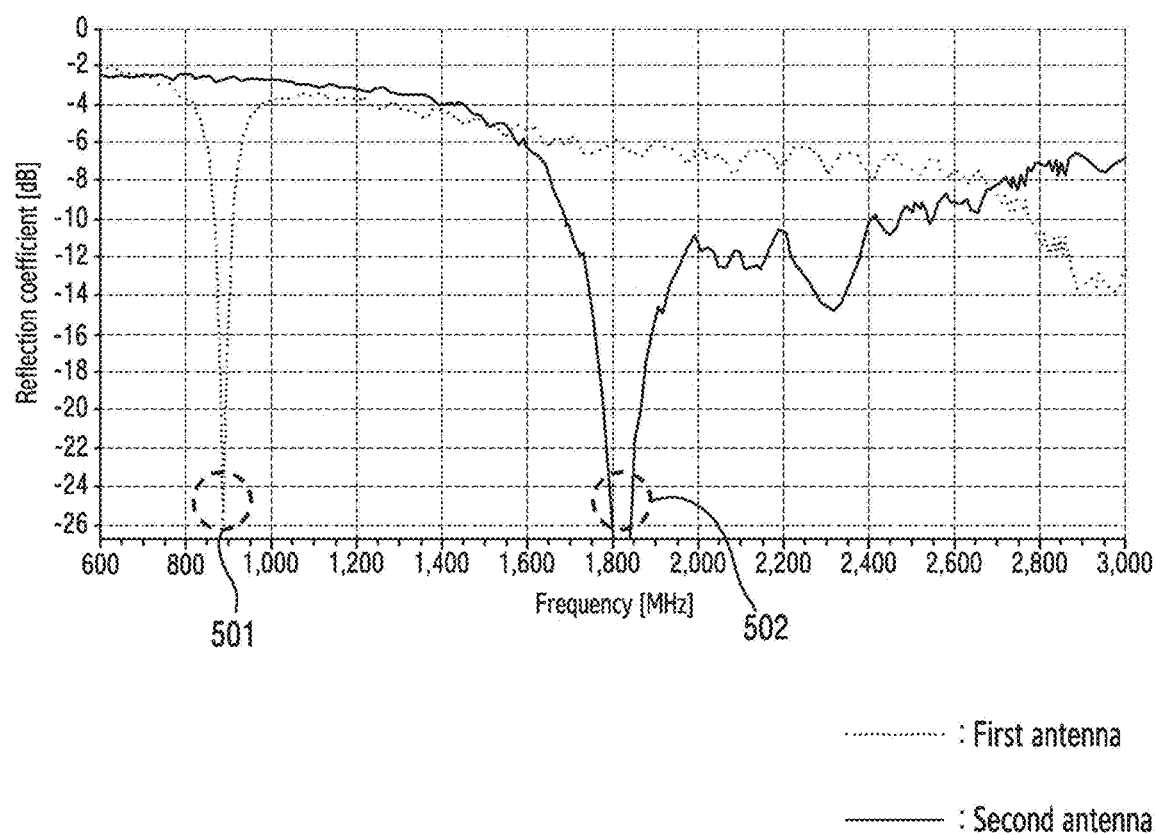
FIG. 5 is a graph illustrating an operating frequency band formed by an antenna of FIG. 4B according to embodiments of the disclosure.

FIG. 5 is a graph illustrating an operating frequency band formed by the antenna of FIG. 4B according to embodiments of the disclosure. It is obvious from the graph that the antennas (for example, the antennas A1 and D2 in FIG. 4A) electrically connected to the first conductive area (for example, the first conductive area 1111 in FIG. 4B) of the rear plate (for example, the rear plate 111 in FIG. 4B) are isolated from each other by the ground extension portion (for example, the ground extension portion 403 in FIG. 4B) such that resonance occurs efficiently in the low band (area 501) and mid-band (area 502).

Figure 6A:
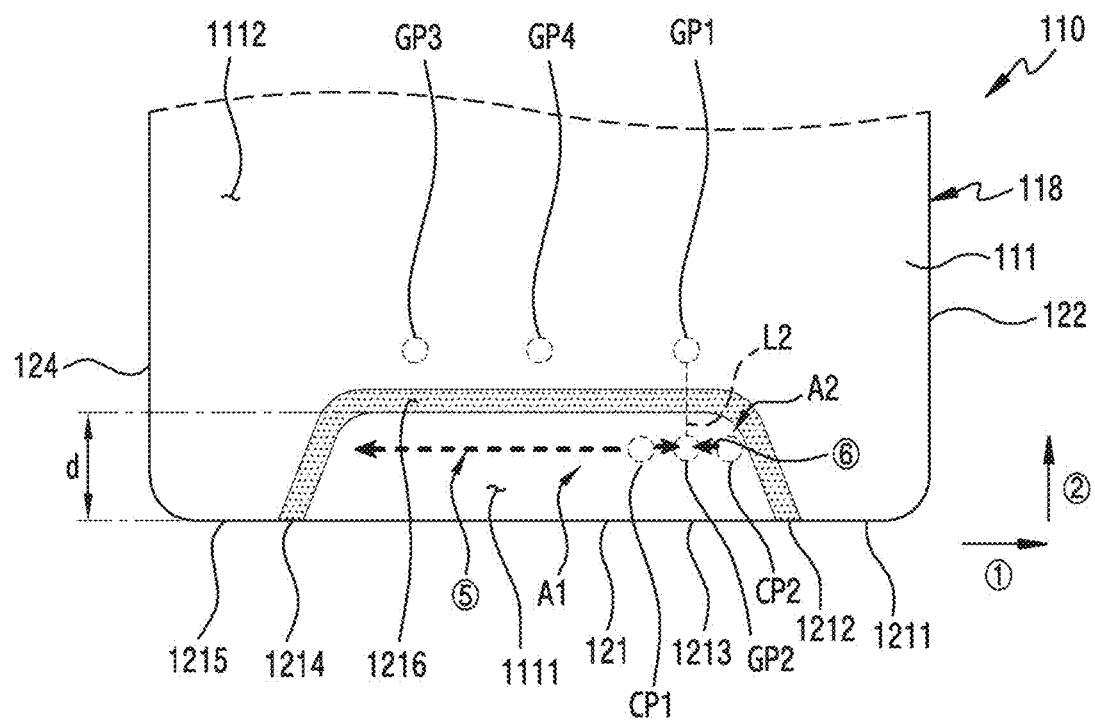
FIG. 6A illustrates a configuration of a housing according to embodiments of the disclosure.

FIG. 6A illustrates a configuration of a housing according to embodiments of the disclosure.

Figure 6B:
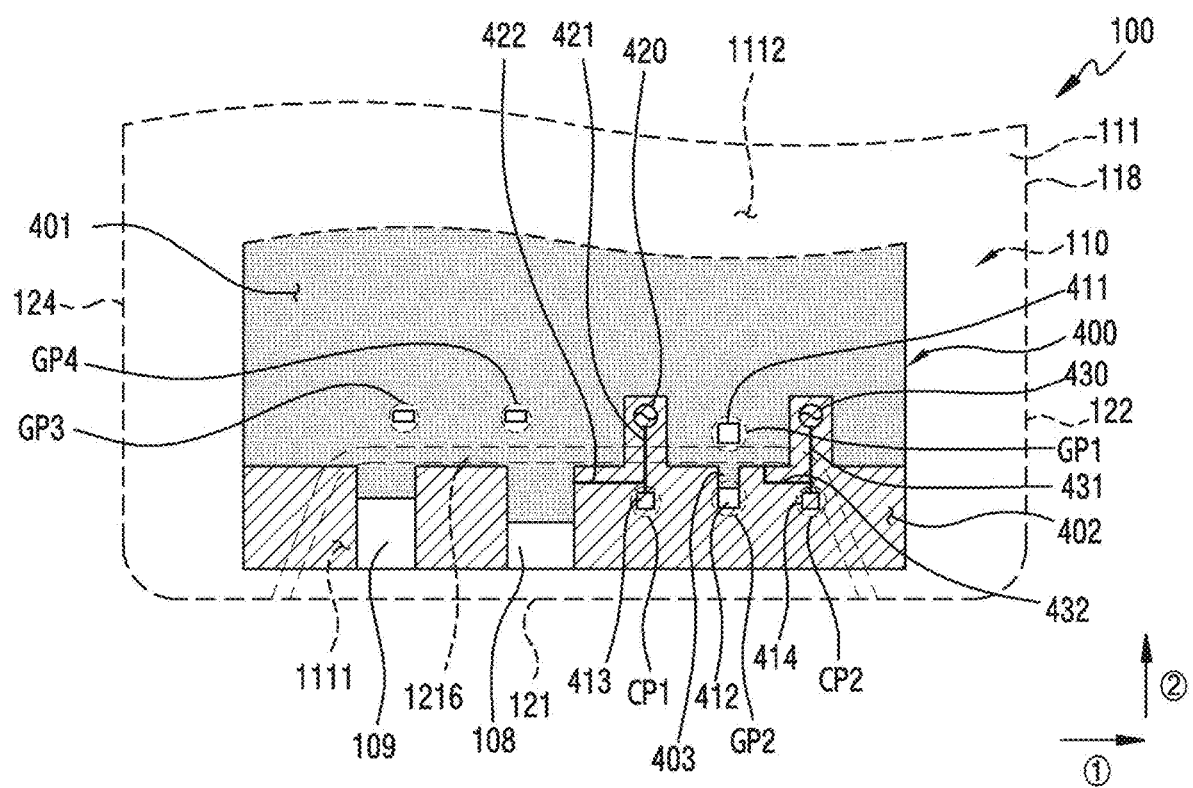
FIG. 6B is a diagram of an electronic device illustrating a configuration of an antenna as a result of coupling a printed circuit board and the housing of FIG. 6A according to embodiments of the disclosure.

FIG. 6B is a diagram of an electronic device illustrating a configuration of an antenna as a result of coupling a printed circuit board and the housing of FIG. 6A according to embodiments of the disclosure.

Referring to FIGS. 6A and 6B, the printed circuit board 400 may have the ground extension portion 403 formed so as to extend from the main ground plane 401 toward the first side surface 121 and to have a length smaller than the ground extension portion 403 in FIG. 4B. For example, the second isolation line L2 that electrically connects the first conductive area 1111 and the second conductive area 1112 by the ground extension portion 403 when the rear plate 111 and the printed circuit board 400 are coupled may have a length smaller than that of the above-described first isolation line L1 in FIG. 4A.

According to embodiments of the disclosure, when the electronic device 100 is assembled, the first conductive area 1111 of the rear plate 111 may be electrically connected to the third electric connector 413 so as to operate as a first antenna A1 having the first radiation path ⑤ in FIG. 6A. According to an embodiment of the disclosure, when the electronic device 100 is assembled, the first conductive area 1111 of the rear plate 111 may be electrically connected to the fourth electric connector 414 so as to operate as a second antenna A2 having the second radiation path ⑥ in FIG. 6A.

According to embodiments of the disclosure, the electric length of the first antenna A1 and the second antenna A2 may be adjusted according to the length of the ground extension portion 403, and this may result in a resonance frequency shift. For example, as the length of the ground extension portion 403 decreases, the operating frequency band of the first antenna A1 and the second antenna A2 may shift toward the high-frequency band.

According to various embodiments, the length of the second isolation line L2 configured by the ground extension portion 403 may be set physically. In another embodiment, the ground extension portion 403 may be set such that the electric length thereof is varied by at least one switching device arranged inside the extension portion.

Figure 7A:
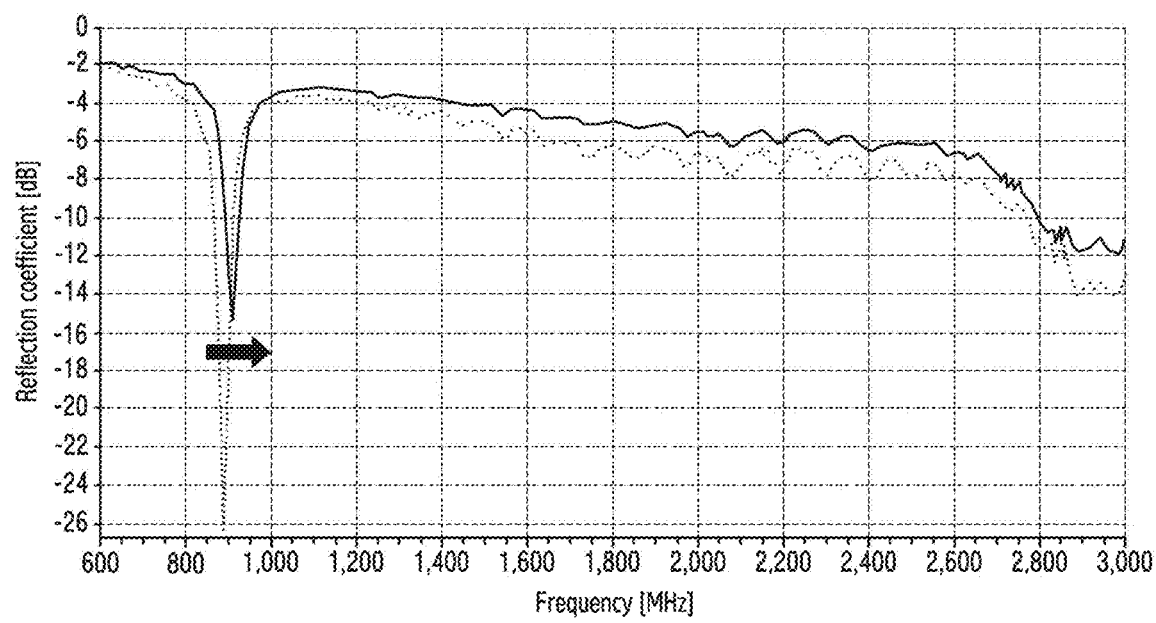
FIG. 7A is a graph illustrating a change in an operating frequency band of the antenna of FIG. 6B according to a change in length of a ground extension portion according to embodiments of the disclosure.

FIG. 7A is a graph illustrating a change in an operating frequency band of the antenna in FIG. 6B according to a change in length of the ground extension portion according to embodiments of the disclosure.

Figure 7B:
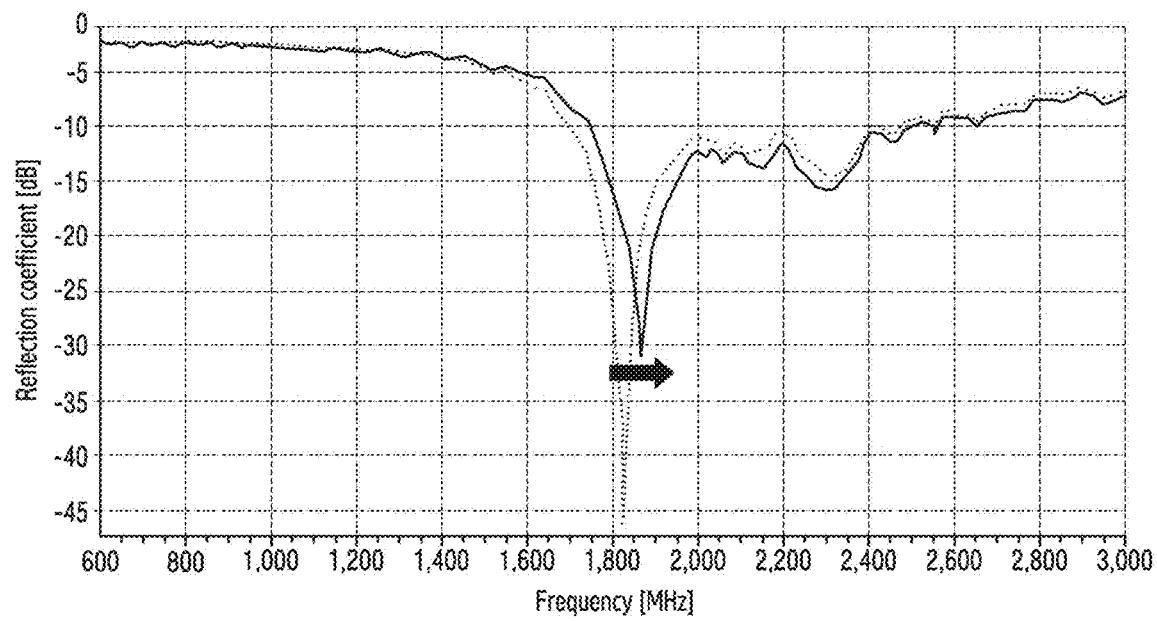
FIG. 7B is another graph illustrating a change in an operating frequency band of the antenna of FIG. 6B according to a change in length of a ground extension portion according to embodiments of the disclosure.

FIG. 7B is another graph illustrating a change in an operating frequency band of the antenna in FIG. 6B according to a change in length of the ground extension portion according to embodiments of the disclosure.

FIG. 7A is a graph illustrating the operating frequency band of the first antenna (for example, the first antenna A1 in FIG. 6A), and it is obvious therefrom that, when the second isolation line in FIG. 6B (for example, the second isolation line L2 in FIG. 6B) is applied in comparison with the first isolation line in FIG. 4B (for example, the first isolation line L1 in FIG. 4A), the first antenna A1 is shifted from the low band toward the high-frequency band (along the illustrated arrow).

FIG. 7B is a graph illustrating the operating frequency band of the second antenna (for example, the second antenna A2 in FIG. 6A), and it is obvious therefrom that, when the second isolation line in FIG. 6B (for example, the second isolation line L2 in FIG. 6B) is applied in comparison with the first isolation line in FIG. 4B (for example, the first isolation line L1 in FIG. 4B), the second antenna A2 is shifted from the mid-band toward the high-frequency band (along the illustrated arrow).

Figure 8A:
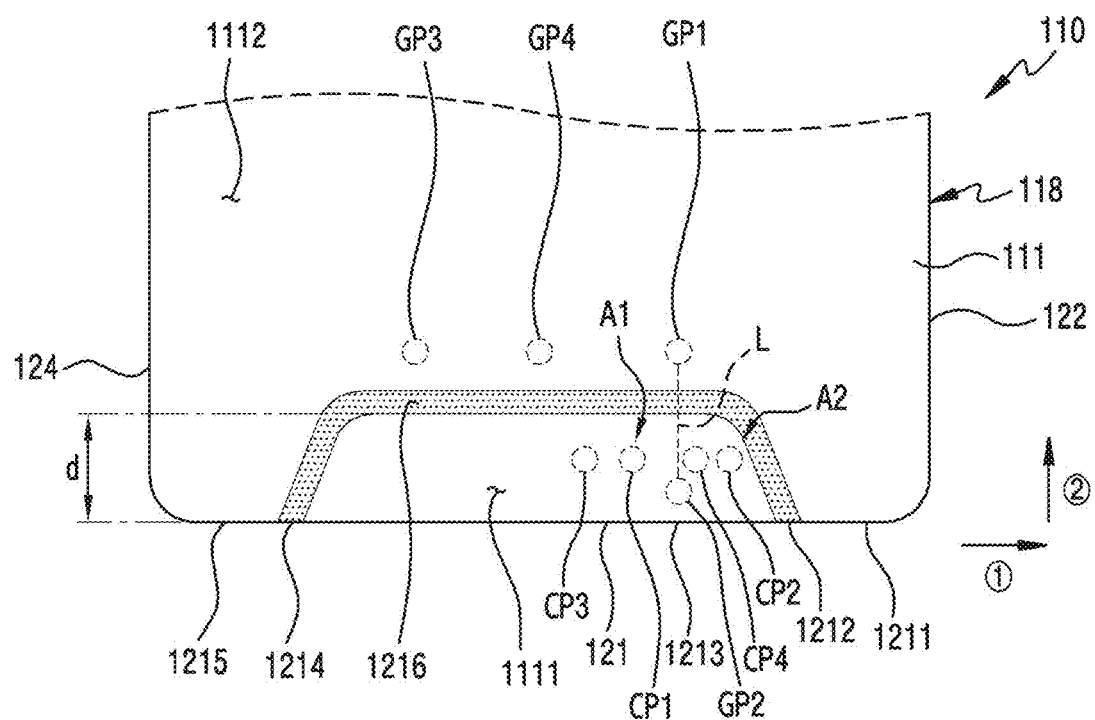
FIG. 8A illustrates a configuration of a housing according to embodiments of the disclosure.

FIG. 8A illustrates a configuration of a housing according to embodiments of the disclosure.

Figure 8B:
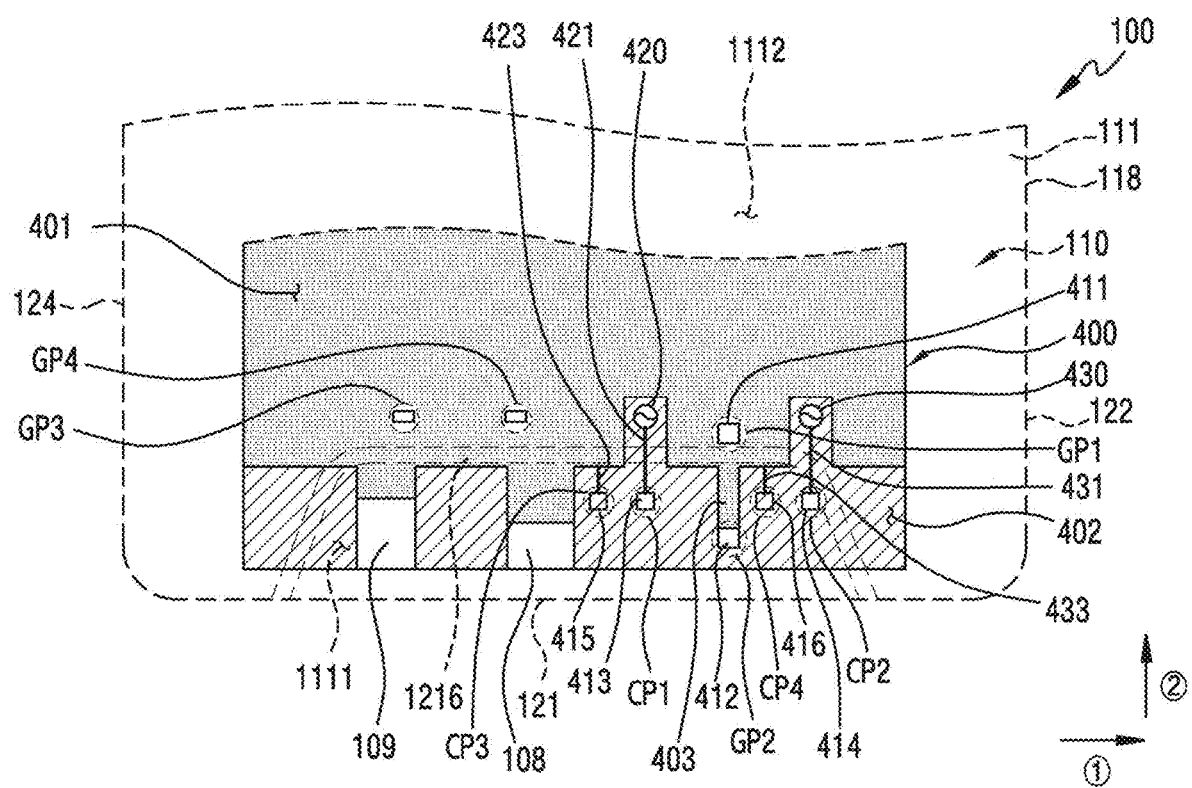
FIG. 8B is a diagram of an electronic device illustrating a configuration of an antenna as a result of coupling a printed circuit board and the housing of FIG. 8A according to embodiments of the disclosure.

FIG. 8B is a diagram of an electronic device illustrating a configuration of an antenna as a result of coupling a printed circuit board and the housing of FIG. 8A according to embodiments of the disclosure.

The above-described FIGS. 4A and 4B may include the second electric path 422 which branches off from the first electric path 421, and which is electrically connected to the main ground plane 401, and the fourth electric path 432 which branches off from the third electric path 431, and which is electrically connected to the main ground plane 401, such that the first antenna A1 and the second antenna A2 operate as a PIFA.

Referring to FIGS. 8A and 8B, the third contact point CP3 and the fourth contact point CP4 of the printed circuit board 400 may be used to replace and implement the second electric path (for example, the second electric path 422 in FIG. 4B) and the fourth electric path (for example, the fourth electric path 432 in FIG. 4B) such that the first antenna A1 and the second antenna A2 operate as a PIFA on opposite sides of the isolation line L. For example, a fifth electric connector 415 may be mounted in the nonconductive area 402 of the printed circuit board 400, which corresponds to the third contact point CP3, and a sixth electric connector 416 may be mounted in the nonconductive area 402 of the printed circuit board 400, which corresponds to the fourth contact point CP4. According to an embodiment of the disclosure, the fifth electric connector 415 may be electrically connected to the main ground plane 401 through the fifth electric path 423, and the sixth electric connector 416 may be electrically connected to the main ground plane 401 through the sixth electric path 433.

According to embodiments of the disclosure, when the electric device 100 is assembled, the fifth electric connector 415 may be electrically connected to the first conductive area 1111 of the rear plate 111 such that the first antenna A1 operates as a PIFA. According to an embodiment of the disclosure, when the electronic device 100 is assembled, the sixth electric connector 416 may be electrically connected to the first conductive area 1111 of the rear plate 111 such that the second antenna A2 also operates as a PIFA.

Figure 9:
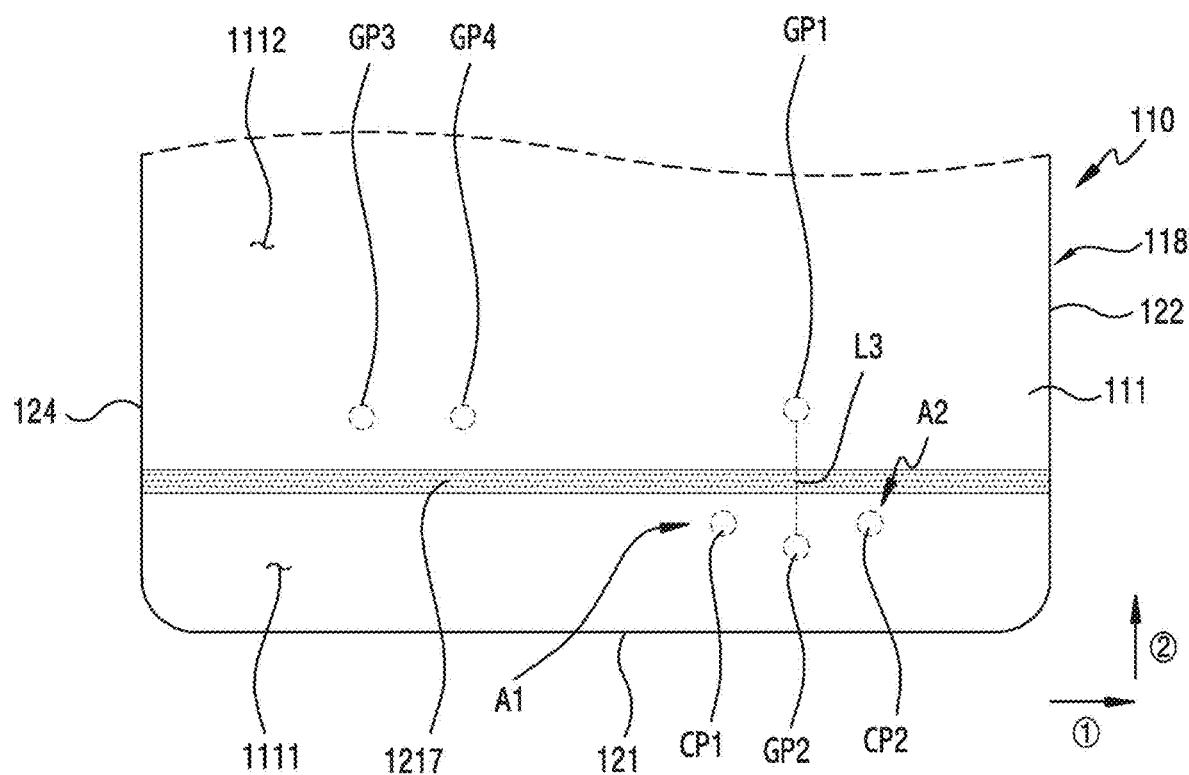
FIG. 9 illustrates a configuration of a housing including a nonconductive slit according to embodiments of the disclosure.

FIG. 9 illustrates a configuration of a housing including a nonconductive slit according to embodiments of the disclosure.

Referring to FIG. 9, the rear plate 111 may be electrically divided into the first conductive area 1111 and the second conductive area 1112 by the nonconductive slit 1217. According to an embodiment of the disclosure, the nonconductive slit 1217 may extend from the second side surface 122 to the fourth side surface 124. According to an embodiment of the disclosure, at least a part of the first conductive area 1111 of the rear plate 111 may operate as a first antenna A1 formed by a first contact point CP1 formed on one side with reference to a third isolation line L3 that extends from the first ground point GP1 arranged in the second conductive area 1112 across the nonconductive slit 1217 to the second ground point GP2 arranged in the first conductive area 1111, thereby connecting both, and as a second antenna A2 formed by a second contact point CP2 formed on the other side.

Figure 10A:
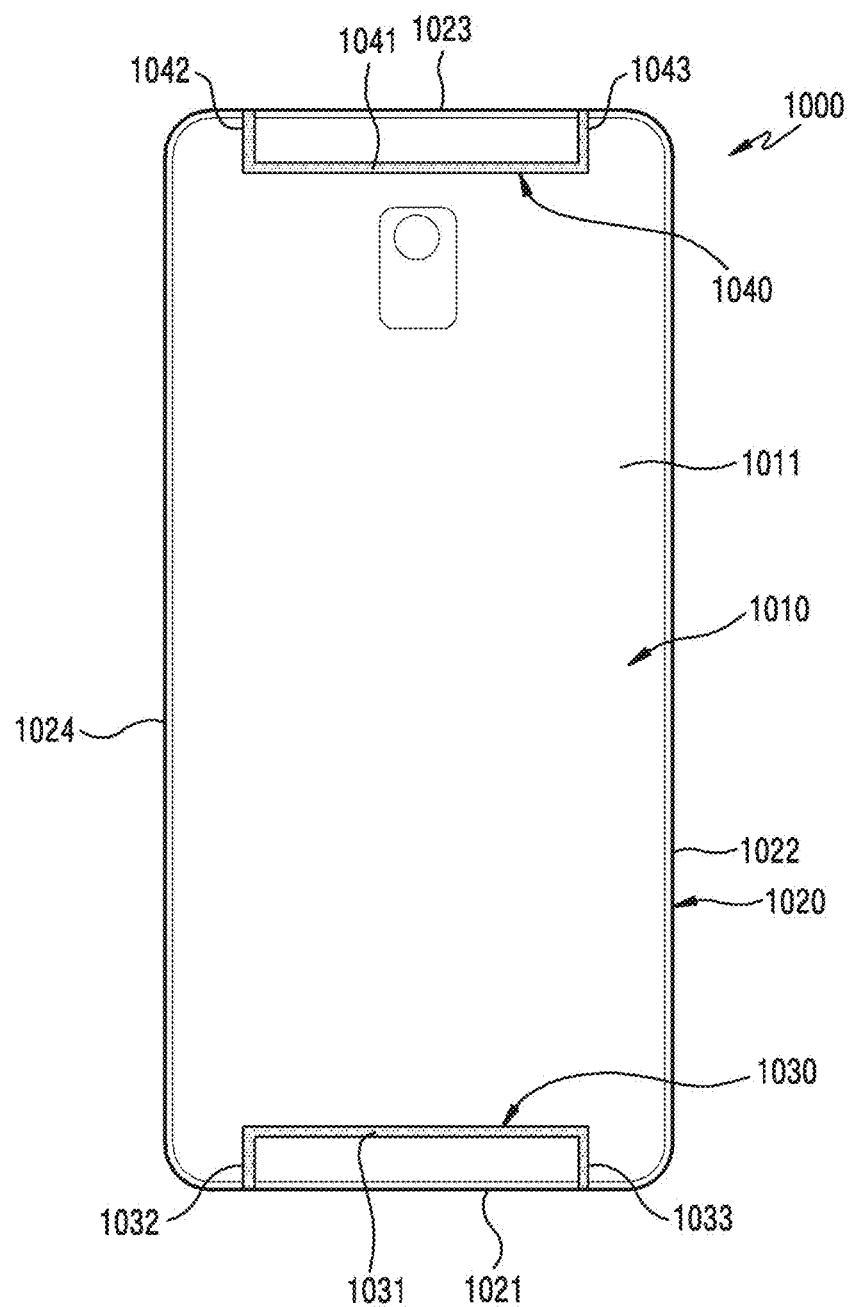
FIG. 10A illustrates an electronic device including a variously shaped nonconductive slit according to embodiments of the disclosure.
Figure 10B:
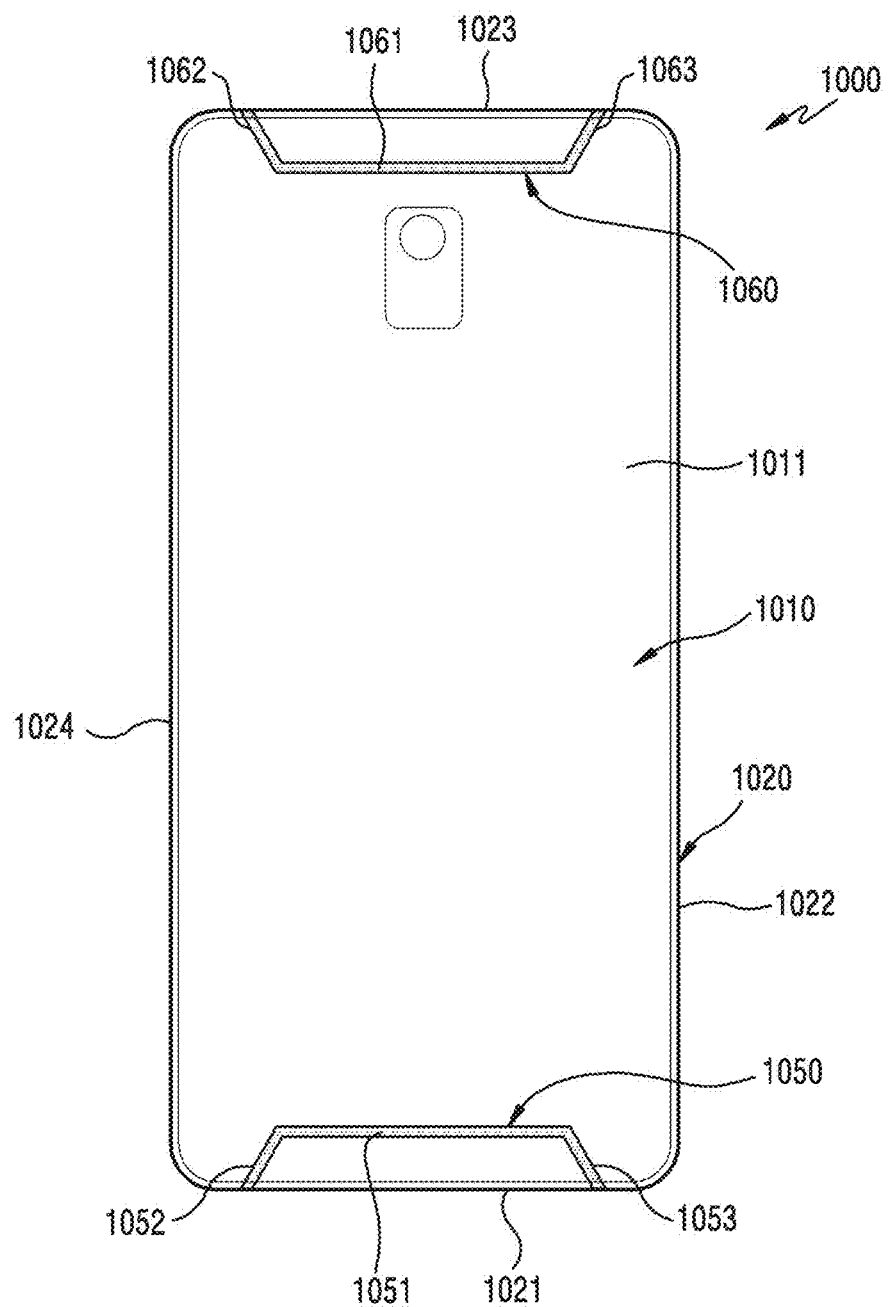
FIG. 10B illustrates another electronic device including a variously shaped nonconductive slit according to embodiments of the disclosure.
Figure 10C:
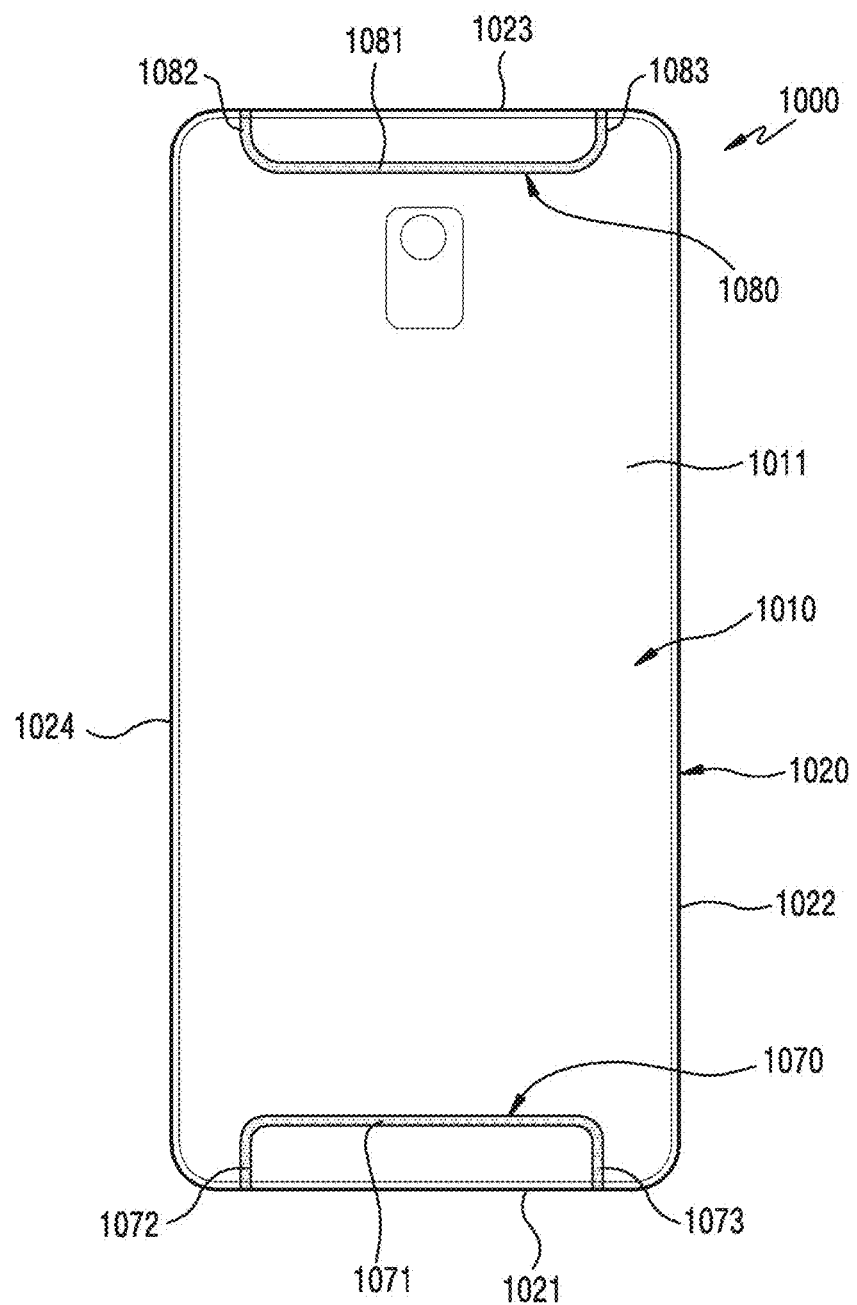
FIG. 10C illustrates another electronic device including a variously shaped nonconductive slit according to embodiments of the disclosure.

FIGS. 10A, 10B and 10C illustrate electronic devices including variously shaped nonconductive slits according to embodiments of the disclosure.

Referring to FIG. 10A, an electronic device 1000 (for example, the electronic device 100 in FIG. 1) may include a housing 1010 including a conductive member (for example, a metallic member) in at least a partial area thereof. According to an embodiment of the disclosure, the housing 1010 may include a front plate (not illustrated), a rear plate 1011 which is spaced apart from the front plate by a predetermined interval, and which faces in the opposite direction to the front plate, and a side member 1020 (for example, a side support member or a side surface) arranged so as to at least partially surround the space between the front plate and the rear plate 1011. According to an embodiment of the disclosure, the front plate, the rear plate 1011, and the side member 1020 may be formed integrally.

According to various embodiments of the disclosure, the side member 1020 may include a first side surface 1021, a second side surface 1022, a third side surface 1023, and a fourth side surface 1024. According to an embodiment of the disclosure, the rear plate 1011 may have a first nonconductive slit 1030 and a second nonconductive slit 1040 provided such that respective slit portions 1031 and 1041 are formed substantially in parallel with the first side surface 1021 and the third side surface 1023. According to an embodiment of the disclosure, the first nonconductive slit 1030 may include the first slit portion 1031, a first nonconductive extension portion 1032, and a second nonconductive extension portion 1033, which extend from both ends of the first slit portion 1031 to the first side surface 1021, respectively. According to an embodiment of the disclosure, the second nonconductive slit 1040 may include the second slit portion 1041, a third nonconductive extension portion 1042, and a fourth nonconductive extension portion 1043, which extend from both ends of the second slit portion 1041 to the third side surface 1023, respectively. According to an embodiment of the disclosure, the first nonconductive extension portion 1032 and the second nonconductive extension portion 1033 may be formed substantially in parallel with the second side surface 1022 and the fourth side surface 1024, for example, substantially perpendicularly from the first slit portion 1031 toward the first side surface. According to an embodiment of the disclosure, the third nonconductive extension portion 1042 and the fourth nonconductive extension portion 1043 may also be formed substantially in parallel with the second side surface 1022 and the fourth side surface 1024, for example, substantially perpendicularly from the second slit portion 1041 toward the third side surface 1023.

Referring to FIG. 10B, which illustrates a configuration similar to the housing 1010 in FIG. 10A, a first nonconductive slit 1050 may have a first nonconductive extension portion 1052 and a second nonconductive extension portion 1053 formed in the shape of sloping straight lines such that first ends of the first nonconductive extension portion 1052 and the second nonconductive extension portion 1053 are connected to both ends of a first slit portion 1051, respectively, and the second ends of the first nonconductive extension portion 1052 and the second nonconductive extension portion 1053 extend to the first side surface 1021 so as to be closer to the second side surface 1022 and the fourth side surface 1024 than the first ends, respectively. According to an embodiment of the disclosure, a second nonconductive slit 1060 may have a third nonconductive extension portion 1062 and a fourth nonconductive extension portion 1063 formed in the shape of sloping straight lines such that first ends of the third nonconductive extension portion 1062 and the fourth nonconductive extension portion 1063 are connected to both ends of a second slit portion 1061, respectively, and the second ends of the third nonconductive extension portion 1062 and the fourth nonconductive extension portion 1063 extend to the third side surface 1023 so as to be closer to the second side surface 1022 and the fourth side surface 1024 than the first ends, respectively.

Referring to FIG. 10C, which illustrates a configuration similar to the housing 1010 in FIG. 10A, a first nonconductive slit 1070 may have a first nonconductive extension portion 1072 and a second nonconductive extension portion 1073 formed substantially in parallel with a second side surface 1022 and the fourth side surface 1024, for example, substantially perpendicularly from both ends of a first slit portion 1071 toward the first side surface 1021 so as to have parts bent in curved shapes, respectively. According to an embodiment of the disclosure, a second nonconductive slit 1080 may have a third nonconductive extension portion 1082 and a fourth nonconductive extension portion 1083 formed substantially in parallel with the second side surface 1022 and the fourth side surface 1024, for example, substantially perpendicularly from ends of a second slit portion 1081 toward the third side surface 1023 so as to have parts bent in curved shapes, respectively.

According to embodiments of the disclosure, at least one of the above-described nonconductive slits 1030, 1040, 1050, 1060, 1070, and 1080 may be formed in a single housing 1010 in the same shape, or a plurality thereof may be formed in different shapes.

Figure 11:
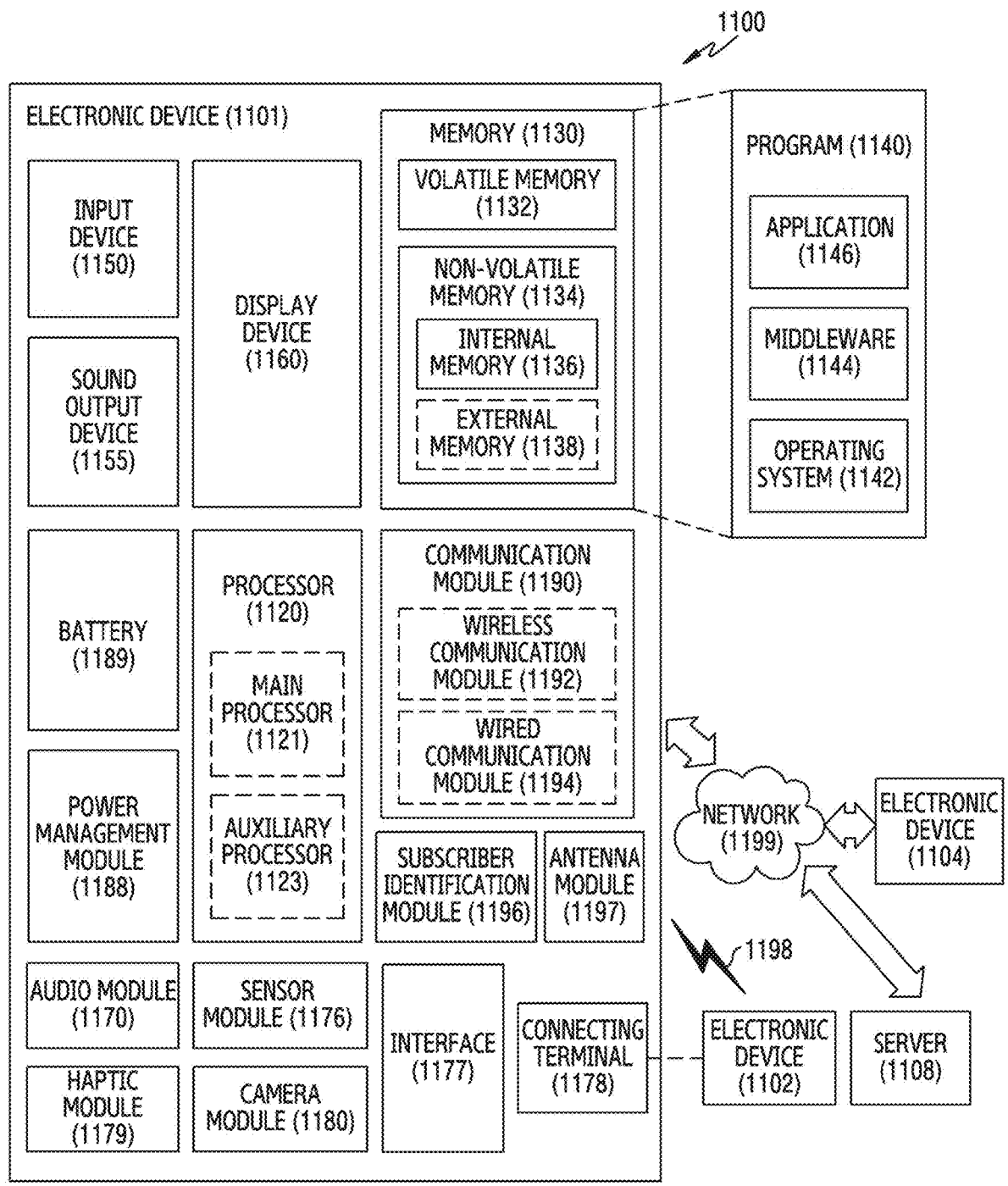
FIG. 11 is a block diagram of an electronic device in a network environment according to embodiments of the disclosure.

FIG. 11 is a block diagram illustrating an electronic device in a network environment according to embodiments of the disclosure.

Referring to FIG. 11, an electronic device 1101 in a network environment 1100 may communicate with an electronic device 1102 via a first network 1198 (e.g., a short-range wireless communication network), or an electronic device 1104 or a server 1108 via a second network 1199 (e.g., a long-range wireless communication network). According to an embodiment of the disclosure, the electronic device 1101 may communicate with the electronic device 1104 via the server 1108. According to an embodiment of the disclosure, the electronic device 1101 may include a processor 1120, memory 1130, an input device 1150, a sound output device 1155, a display device 1160, an audio module 1170, a sensor module 1176, an interface 1177, a haptic module 1179, a camera module 1180, a power management module 1188, a battery 1189, a communication module 1190, a subscriber identification module (SIM) 1196, or an antenna module 1197. In some embodiments of the disclosure, at least one (e.g., the display device 1160 or the camera module 1180) of the components may be omitted from the electronic device 1101, or one or more other components may be added in the electronic device 1101. In some embodiments of the disclosure, some of the components may be implemented as single integrated circuitry. For example, the sensor module 1176 (e.g., a fingerprint sensor, an iris sensor, or an illuminance sensor) may be implemented as embedded in the display device 1160 (e.g., a display).

The processor 1120 may execute, for example, software (e.g., a program 1140) to control at least one other component (e.g., a hardware or software component) of the electronic device 1101 coupled with the processor 1120, and may perform various data processing or computations. According to an embodiment of the disclosure, as at least part of the data processing or computation, the processor 1120 may load a command or data received from another component (e.g., the sensor module 1176 or the communication module 1190) in volatile memory 1132, process the command or the data stored in the volatile memory 1132, and store resulting data in non-volatile memory 1134. According to an embodiment of the disclosure, the processor 1120 may include a main processor 1121 (e.g., a central processing unit (CPU) or an AP), and an auxiliary processor 1123 (e.g., a graphics processing unit (GPU), an ISP, a sensor hub processor, or a CP) that is operable independently from, or in conjunction with, the main processor 1121. Additionally or alternatively, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of the functions or states related to at least one component (e.g., the display device 1160, the sensor module 1176, or the communication module 1190) among the components of the electronic device 1101, instead of the main processor 1121, while the main processor 1121 is in an inactive (e.g., sleep) state, or together with the main processor 1121 while the main processor 1121 is in an active state (e.g., executing an application). According to an embodiment of the disclosure, the auxiliary processor 1123 (e.g., an ISP or a CP) may be implemented as part of another component (e.g., the camera module 1180 or the communication module 1190) functionally related to the auxiliary processor 1123.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 and/or the non-volatile memory 1134. The non-volatile memory 1134 can further include an internal memory 1136 or an external memory 1138.

The program 1140 may be stored in the memory 1130 as software, and may include, for example, an operating system (OS) 1142, middleware 1144, or an application 1146.

The input device 1150 may receive a command or data to be used by other components (e.g., the processor 1120) of the electronic device 1101, from the outside (e.g., a user) of the electronic device 1101. The input device 1150 may include, for example, a microphone, a mouse, a keyboard, or a digital pen (e.g., a stylus pen).

The sound output device 1155 may output sound signals to the outside of the electronic device 1101. The sound output device 1155 may include, for example, a speaker or a receiver. The speaker may be used for general purposes, such as playing multimedia or playing recordings, and the receiver may be used for incoming calls. According to an embodiment of the disclosure, the receiver may be implemented as separate from, or as part of the speaker.

The display device 1160 may visually provide information to the outside (e.g., a user) of the electronic device 1101. The display device 1160 may include, for example, a display, a hologram device, or a projector and control circuitry to control a corresponding one of the display, hologram device, and projector. According to an embodiment of the disclosure, the display device 1160 may include touch circuitry adapted to detect a hovering and a touch, or sensor circuitry (e.g., a pressure sensor) adapted to measure the intensity of force incurred by the touch.

The audio module 1170 may convert a sound into an electrical signal and convert an electrical signal into sound. According to an embodiment of the disclosure, the audio module 1170 may obtain the sound via the input device 1150, or output the sound via the sound output device 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment of the disclosure, the sensor module 1176 may include, for example, a gesture sensor, a gyro sensor, an atmospheric pressure sensor, a magnetic sensor, an acceleration sensor, a grip sensor, a proximity sensor, a color sensor, an IR sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment of the disclosure, the interface 1177 may include, for example, a HDMI, a USB interface, an SD card interface, or an audio interface.

A connecting terminal 1178 may include a connector via which the electronic device 1101 may be physically connected with the external electronic device (e.g., the electronic device 1102). According to an embodiment of the disclosure, the connecting terminal 1178 may include, for example, a HDMI connector, a USB connector, an SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 1179 may include, for example, a motor, a piezoelectric element, or an electric stimulator.

The camera module 1180 may capture still images or moving images, or combinations thereof. According to an embodiment of the disclosure, the camera module 1180 may include one or more lenses, image sensors, ISPs, or flashes.

The power management module 1188 may manage power supplied to or consumed by the electronic device 1101. According to an embodiment of the disclosure, the power management module 1188 may be implemented as at least part of, for example, a power management integrated circuit (PMIC).

The battery 1189 may supply power to at least one component of the electronic device 1101. According to an embodiment of the disclosure, the battery 1189 may include, for example, a primary cell which is not rechargeable, a secondary cell which is rechargeable, a fuel cell, or combinations thereof.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more CPs that are operable independently from the processor 1120 (e.g., the AP) and supports a direct (e.g., wired) communication or a wireless communication. According to an embodiment of the disclosure, the communication module 1190 may include a wireless communication module 1192 (e.g., a cellular communication module, a short-range wireless communication module, or a global navigation satellite system (GNSS) communication module) or the wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, Wi-Fi direct, or infrared data association (IrDA)) or the second network 1199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the SIM 1196.

The antenna module 1197 may transmit or receive a signal or power to or from the outside (e.g., the external electronic device) of the electronic device 1101. According to an embodiment of the disclosure, the antenna module 1197 may include an antenna including a radiating element composed of a conductive material or a conductive pattern formed in or on a substrate (e.g., printed circuit board (PCB)). According to an embodiment of the disclosure, the antenna module 1197 may include a plurality of antennas. In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment of the disclosure, another component (e.g., a radio frequency integrated circuit (RFIC)) other than the radiating element may be additionally formed as part of the antenna module 1197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 1101 and the external electronic device 1104 via the server 1108 coupled with the second network 1199. Each of the electronic devices 1102 and 1104 may be a device of a same type as, or a different type, from the electronic device 1101. According to an embodiment of the disclosure, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, or client-server computing technology may be used, for example.

An electronic device according to embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Embodiments of the disclosure as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to embodiments of the disclosure may also be included and provided in a computer program product. The computer program product may be traded as a product between a seller and a buyer. The computer program product may be distributed in the form of a machine-readable storage medium (e.g., compact disc read only memory (CD-ROM)), or may be distributed (e.g., downloaded or uploaded) online via an application store (e.g., PlayStore™) or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to embodiments of the disclosure, each component (e.g., a module or a program) of the above-described components may include a single entity or multiple entities. According to embodiments of the disclosure, one or more of the above-described components may be omitted, or one or more other components may be added. Alternatively or additionally, a plurality of components (e.g., modules or programs) may be integrated into a single component. In such a case, according to embodiments of the disclosure, the integrated component may still perform one or more functions of each of the plurality of components in the same or similar manner as they are performed by a corresponding one of the plurality of components before the integration. According to embodiments of the disclosure, operations performed by the module, the program, or another component may be carried out sequentially, in parallel, repeatedly, or heuristically, or one or more of the operations may be executed in a different order or omitted entirely, or one or more other operations may be added.

According to embodiments of the disclosure, the electronic device (for example, the electronic device 100 in FIG. 2) may also include a housing (for example, the housing 110 in FIG. 1) including a front plate (for example, the front plate 102 in FIG. 1), a rear plate (for example, the rear plate 111 in FIG. 2) facing in the opposite direction to the front plate, and a side member (for example, the side member 118 in FIG. 2) surrounding the space between the front plate and the rear plate. The side member may include a first side surface (for example, the first side surface 121 in FIG. 2) extending in a first direction (for example, direction ① in FIG. 2) and having a first length, a second side surface (for example, the second side surface 122 in FIG. 2) extending in a second direction (for example, direction ② in FIG. 2) perpendicular to the first direction and having a second length larger than the first length, a third side surface (for example, the third side surface 123 in FIG. 2) extending in parallel with the first side surface and having the first length, and a fourth side surface (for example, the fourth side surface 124 in FIG. 2) extending in parallel with the second side surface and having the second length. The first side surface may include a first conductive part (for example, the first conductive part 1211 in FIG. 2), a first nonconductive part (for example, the first nonconductive part 1212 in FIG. 2), a second conductive part (for example, the second conductive part 1213 in FIG. 2), a second nonconductive part (for example, the second nonconductive part 1214 in FIG. 2), and a third conductive part (for example, the third conductive part 1215 in FIG. 2) successively arranged between the second side surface and the fourth side surface. The rear plate may include, when seen from above the rear plate, a nonconductive slit (for example, the first nonconductive slit 1216 in FIG. 4A) extending from the first nonconductive part to the second nonconductive part, a first conductive area (for example, the first conductive area 1111 in FIG. 4A) surrounded by the second conductive part and the nonconductive slit, and a second conductive area (for example, the second conductive area 1112 in FIG. 4A) positioned outside the first conductive area across the nonconductive slit. The electronic device may also include a touch screen display (for example, the display 101 in FIG. 1) arranged inside the housing (for example, the housing 110 in FIG. 4A) and exposed through a part of the front plate.

The electronic device may also include a PCB (for example, the PCB 400 in FIG. 4B) including a ground plane (for example, the main ground plane 401 in FIG. 4B) arranged between the front plate and the rear plate in parallel with the rear plate, the ground plane including a peripheral part (for example, the nonconductive area 402 in FIG. 4B) spaced apart from the first side surface, and a conductive path (for example, the ground extension portion 403 in FIG. 4B) extending from a first point (for example, GP1 in FIG. 4B) of the peripheral part to a second point (for example, GP2 in FIG. 4B) thereof toward the first side surface such that, when seen from above the rear plate, the first point overlaps with the second conductive area, and the second point overlaps with the first conductive area.

The electronic device may also include a first flexible conductive member (for example, the first electric connector 411 in FIG. 4B) arranged between the first point and the second conductive area of the rear plate so as to make an electric connection therebetween, a second flexible conductive member (for example, the second electric connector 412 in FIG. 4B) arranged between the second point and the first conductive area of the rear plate so as to make an electric connection therebetween, a third flexible conductive member (for example, the third electric connector 413 in FIG. 4B) arranged between the third point (for example, CP1 in FIG. 4B) and the first conductive area of the rear plate so as to make an electric connection therebetween, a fourth flexible conductive member (for example, the fourth electric connector 414 in FIG. 4B) arranged between the fourth point (for example, CP2 in FIG. 4B) and the first conductive area of the rear plate so as to make an electric connection therebetween, and at least one wireless communication circuit (for example, the wireless communication module 1192 in FIG. 11) arranged on the PCB and electrically connected to the third point and the fourth point. When seen from above the rear plate, the third point and the fourth point may be arranged on both sides of the conductive path, respectively.

According to embodiments of the disclosure, the side member may be formed integrally with the rear plate.

According to embodiments of the disclosure, the distance from the third point or the fourth point to the first side surface may be set on the basis of the frequency supported by the wireless communication circuit.

According to embodiments of the disclosure, the second point may be arranged closer to the first side surface than the third point or the fourth point.

According to embodiments of the disclosure, the electronic device may include a nonconductive area (for example, the nonconductive area 402 in FIG. 4B) extending from the peripheral part of the PCB toward the first side surface when the rear plate is seen from above, and the nonconductive area may be arranged to overlap with at least a part of the first conductive area of the rear plate.

According to embodiments of the disclosure, the second flexible conductive member may be arranged on the conductive path.

According to embodiments of the disclosure, when the rear plate is seen from above, the conductive path from the first flexible conductive member to the second flexible conductive member may be formed to extend from the second conductive area across the nonconductive slit to the first conductive area.

According to embodiments of the disclosure, the third flexible conductive member may be electrically connected to a first feeding portion (for example, the first feeding portion 420 in FIG. 4B) electrically connected to the wireless communication circuit through a first electric path (for example, the first electric path 421 in FIG. 4B) arranged on the PCB.

According to embodiments of the disclosure, the electronic device may also include a second electric path (for example, the second electric path 422 in FIG. 4B) electrically connected to a part of the first electric path and to the ground plane.

According to embodiments of the disclosure, the first feeding portion may be configured to transmit/receive low-band signals through a first antenna that uses the third flexible conductive member and the first conductive area of the rear plate.

According to embodiments of the disclosure, the length of the conductive path may be set according to the operating frequency band of the first antenna.

According to embodiments of the disclosure, the fourth flexible conductive member may be electrically connected to a second feeding portion (for example, the second feeding portion 430 in FIG. 4B) electrically connected to the wireless communication circuit through a third electric path (for example, the third electric path 431 in FIG. 4B) arranged on the PCB.

According to embodiments of the disclosure, the electronic device may also include a fourth electric path (for example, the fourth electric path 432 in FIG. 4B) electrically connected to a part of the third electric path and to the ground plane.

According to embodiments of the disclosure, the second feeding portion may be configured to transmit/receive midband signals through a second antenna that uses the fourth flexible conductive member and the first conductive area of the rear plate.

According to embodiments of the disclosure, the length of the conductive path may be set according to the operating frequency band of the second antenna.

According to embodiments of the disclosure, the electronic device may also include a fifth flexible conductive member (for example, the fifth electric connector 415 in FIG. 8B) mounted at a fifth point (for example, CP3 in FIG. 8B) between the first electric path and the second side surface in the first conductive area, connected to the ground plane through a fifth electric path (for example, the fifth electric path 423 in FIG. 8B), and electrically connected to the first conductive area.

According to embodiments of the disclosure, the electronic device may also include a sixth flexible conductive member (for example, the sixth electric connector 416 in FIG. 8B) mounted at a sixth point (for example, CP4 in FIG. 8B) between the third electric path and the conductive path in the first conductive area, connected to the ground plane through a sixth electric path (for example, the sixth electric path 433 in FIG. 8B), and electrically connected to the first conductive area.

According to embodiments of the disclosure, the electronic device may also include at least one flexible conductive member arranged at least one point (for example, GP3 and GP4 in FIG. 4B) of the ground plane of the PCB, and the flexible conductive member may be electrically connected to the second conductive area of the rear plate.

According to embodiments of the disclosure, at least one electronic component (for example, the electronic components 108 and 109 in FIG. 4B) made of a metallic material may be mounted in at least a partial area of the PCB, and the at least one electronic component may include at least one of an interface connector port, an ear jack assembly, a speaker device, a microphone device, a camera device, or various sensor modules.

According to embodiments of the disclosure, the first flexible conductive member (for example, the first electric connector 411 in FIG. 4B), the second flexible conductive member (for example, the second electric connector 412 in FIG. 4B), the third flexible conductive member (for example, the third electric connector 413 in FIG. 4B), and/or the fourth flexible conductive member (for example, the fourth electric connector 414 in FIG. 4B) may include at least one of a C-clip, a conductive tape, or a conductive pad.

While the disclosure has been shown and described with reference to various embodiments thereof, it will be understood by those skilled in the art that various changes in form and detail may be made therein without departing from the spirit and scope of the disclosure as defined by the appended claims and their equivalents.

What is claimed is:

1. An electronic device comprising:
    a housing comprising a front plate, a rear plate facing in the opposite direction to the front plate, and a side member surrounding the space between the front plate and the rear plate;
    the side member comprising:
        a first side surface extending in a first direction and having a first length,
        a second side surface extending in a second direction perpendicular to the first direction and having a second length larger than the first length,
        a third side surface extending in parallel with the first side surface and having the first length, and
        a fourth side surface extending in parallel with the second side surface and having the second length,
        wherein the first side surface comprises a first conductive part, a first nonconductive part, a second conductive part, a second nonconductive part, and a third conductive part successively arranged between the second side surface and the fourth side surface, and
        wherein the rear plate comprises, when seen from above the rear plate, a nonconductive slit extending from the first nonconductive part to the second nonconductive part, a first conductive area surrounded by the second conductive part and the nonconductive slit, and a second conductive area positioned outside the first conductive area across the nonconductive slit;
    a touch screen display arranged inside the housing and exposed through a part of the front plate;
    a printed circuit board comprising:
        a ground plane arranged between the front plate and the rear plate in parallel with the rear plate,
        wherein the ground plane comprises a peripheral part spaced apart from the first side surface, and
        wherein the printed circuit board comprises a conductive path extending from a first point of the peripheral part to a second point thereof toward the first side surface such that, when seen from above the rear plate, the first point overlaps with the second conductive area, and the second point overlaps with the first conductive area;
    a first flexible conductive member arranged between the first point and the second conductive area of the rear plate so as to make an electric connection therebetween;
    a second flexible conductive member arranged between the second point and the first conductive area of the rear plate so as to make an electric connection therebetween;
    a third flexible conductive member arranged between the third point and the first conductive area of the rear plate so as to make an electric connection therebetween;
    a fourth flexible conductive member arranged between the fourth point and the first conductive area of the rear plate so as to make an electric connection therebetween; and
    at least one wireless communication circuit arranged on the printed circuit board and electrically connected to the third point and the fourth point,
    wherein, when seen from above the rear plate, the third point and the fourth point are arranged on both sides of the conductive path, respectively.

2. The electronic device of claim 1, wherein the side member is formed integrally with the rear plate.

3. The electronic device of claim 1, wherein the distance from the third point or the fourth point to the first side surface is set based on a frequency supported by the wireless communication circuit.

4. The electronic device of claim 3, wherein the second point is arranged closer to the first side surface than the third point or the fourth point.

5. The electronic device of claim 1, further comprising:
    a nonconductive area extending from the peripheral part of the printed circuit board toward the first side surface when the rear plate is seen from above,
    wherein the nonconductive area is arranged to overlap with at least a part of the first conductive area of the rear plate.

6. The electronic device of claim 1, wherein the second flexible conductive member is arranged on the conductive path.

7. The electronic device of claim 1, wherein, when the rear plate is seen from above, the conductive path from the first flexible conductive member to the second flexible conductive member is formed to extend from the second conductive area across the nonconductive slit to the first conductive area.

8. The electronic device of claim 1, wherein the third flexible conductive member is electrically connected to a first feeding portion electrically connected to the wireless communication circuit through a first electric path arranged on the printed circuit board.

9. The electronic device of claim 8, comprising a second electric path electrically connected to a part of the first electric path and to the ground plane.

10. The electronic device of claim 8, wherein the first feeding portion is configured to transmit/receive low-band signals through a first antenna that uses the third flexible conductive member and the first conductive area of the rear plate.

11. The electronic device of claim 10, wherein the length of the conductive path is set according to an operating frequency band of the first antenna.

12. The electronic device of claim 1, wherein the fourth flexible conductive member is electrically connected to a second feeding portion electrically connected to the wireless communication circuit through a third electric path arranged on the printed circuit board.

13. The electronic device of claim 12, further comprising a fourth electric path electrically connected to a part of the third electric path and to the ground plane.

14. The electronic device of claim 12, wherein the second feeding portion is configured to transmit/receive mid-band signals through a second antenna that uses the fourth flexible conductive member and the first conductive area of the rear plate.

15. The electronic device of claim 14, wherein the length of the conductive path is set according to an operating frequency band of the second antenna.

16. The electronic device of claim 1, further comprising:
a fifth flexible conductive member mounted at a fifth point between the first electric path and the second side surface in the first conductive area,
wherein the fifth flexible conductive member is connected to the ground plane through a fifth electric path and is electrically connected to the first conductive area.

17. The electronic device of claim 1, further comprising:
a sixth flexible conductive member mounted at a sixth point between the third electric path and the conductive path in the first conductive area,
wherein the sixth flexible conductive member is connected to the ground plane through a sixth electric path and is electrically connected to the first conductive area.

18. The electronic device of claim 1, further comprising:
at least one seventh flexible conductive member arranged at least one point of the ground plane of the printed circuit board,
wherein the seventh flexible conductive member is electrically connected to the second conductive area of the rear plate.

19. The electronic device of claim 1,
wherein at least one electronic component comprising a metallic material is mounted between the peripheral part and the first side surface, and
wherein the electronic component comprises at least one of an interface connector port, an ear jack assembly, a speaker device, a microphone device, a camera device, or various sensor modules.

20. The electronic device of claim 1, wherein the first flexible conductive member, the second flexible conductive member, the third flexible conductive member, or the fourth flexible conductive member comprises at least one of a C-clip, a conductive tape, or a conductive pad.

* * * * *